(12) United States Patent
Kim et al.

(10) Patent No.: US 12,153,763 B2
(45) Date of Patent: Nov. 26, 2024

(54) DISPLAY DEVICE INCLUDING A PHOTO SENSOR

(71) Applicant: Samsung Display Co., LTD., Yongin-si (KR)

(72) Inventors: Tae Gyun Kim, Yongin-si (KR); Hee Rim Song, Yongin-si (KR); Dong Hoon Lee, Yongin-si (KR); Yu Jin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/101,026

(22) Filed: Jan. 24, 2023

(65) Prior Publication Data

US 2023/0259238 A1 Aug. 17, 2023

(30) Foreign Application Priority Data

Feb. 14, 2022 (KR) .................. 10-2022-0019175

(51) Int. Cl.
*G06F 3/044* (2006.01)
*G06F 3/041* (2006.01)

(52) U.S. Cl.
CPC ............ *G06F 3/044* (2013.01); *G06F 3/0412* (2013.01); *G06F 2203/04111* (2013.01)

(58) Field of Classification Search
CPC .... G06F 3/0446; G06F 3/0448; G06F 3/0412; G06F 3/044; G06F 2203/04112; G06F 2203/04111; G06V 40/1318; H10K 59/40
See application file for complete search history.

(56) References Cited

U.S. PATENT DOCUMENTS

| | | | |
|---|---|---|---|
| 9,342,176 B2 | 5/2016 | Kim et al. | |
| 2018/0181240 A1* | 6/2018 | Heo | .............. G06F 3/0412 |
| 2021/0096678 A1 | 4/2021 | Kubota et al. | |
| 2021/0376003 A1 | 12/2021 | Xu et al. | |
| 2022/0005891 A1 | 1/2022 | Shu et al. | |

FOREIGN PATENT DOCUMENTS

| | | |
|---|---|---|
| CN | 113424325 A | 9/2021 |
| KR | 10-1050464 B1 | 7/2011 |

OTHER PUBLICATIONS

Taisuke Kamada et al., OLED display incorporating organic photodiodes for fingerprint imaging, society information display (SID), Feb. 18, 2019.

* cited by examiner

*Primary Examiner* — Yaron Cohen
(74) *Attorney, Agent, or Firm* — Lewis Roca Rothgerber Christie LLP

(57) ABSTRACT

A display device includes: a base layer; a circuit layer provided on the base layer, the circuit layer including pixel circuits and sensor circuits; a pixel element layer provided on the circuit layer, the pixel element layer including light emitting elements respectively connected to the pixel circuits and light receiving elements respectively connected to the sensor circuits; an encapsulation layer covering the pixel element layer; and a touch sensing layer on the encapsulation layer, the touch sensing layer including a conductive pattern forming touch electrodes for sensing a touch. The light emitting elements include light emitting layers, and the light receiving elements include light receiving layers. The conductive pattern includes main patterns respectively surrounding the light receiving layers in a closed form.

20 Claims, 14 Drawing Sheets

DISPLAY DEVICE INCLUDING A PHOTO SENSOR

CROSS-REFERENCE TO RELATED APPLICATION

The present application claims priority to and the benefit of Korean Patent Application No. 10-2022-0019175 filed on Feb. 14, 2022, in the Korean Intellectual Property Office, the entire disclosure of which is incorporated herein by reference.

BACKGROUND

1. Field

Aspects of some embodiments of the present disclosure generally relate to a display device including a photo sensor.

2. Description of Related Art

As the information society is developed, consumer demand for display devices for displaying images has increased in various forms. For example, display devices have been utilized in various electronic devices such as smartphones, digital cameras, notebook computers, navigation systems, and smart televisions.

Recently, technology for integrating and unifying biometric sensors for recognizing a fingerprint or the like with a display panel occupying the widest area in a display device has been researched and developed.

The above information disclosed in this Background section is only for enhancement of understanding of the background and therefore the information discussed in this Background section does not necessarily constitute prior art.

SUMMARY

Aspects of some embodiments include a display device including a conductive pattern of a touch sensing layer, which surrounds light receiving parts (e.g., light receiving layers of light receiving elements) overlapping a bank area in a closed form having substantially the same shape.

According to some embodiments of the present disclosure, a display device includes: a base layer; a circuit layer provided on the base layer, the circuit layer including pixel circuits and sensor circuits; a pixel element layer provided on the circuit layer, the pixel element layer including light emitting elements respectively connected to the pixel circuits and light receiving elements respectively connected to the sensor circuits; an encapsulation layer covering the pixel element layer; and a touch sensing layer on the encapsulation layer, the touch sensing layer including a conductive pattern forming touch electrodes for sensing a touch, wherein the light emitting elements include light emitting layers, and the light receiving elements include light receiving layers, and wherein the conductive pattern includes main patterns respectively surrounding the light receiving layers in a closed form in a plan view.

According to some embodiments, each of the main patterns may not overlap the light receiving layer in a plan view.

According to some embodiments, the main patterns may have a uniform planar shape.

According to some embodiments, the conductive pattern may further include connection patterns connecting adjacent main patterns to each other. The connection patterns may not overlap the light emitting layers in a plan view.

According to some embodiments, a portion of the connection patterns may include an end portion cut off corresponding to a boundary of the touch electrodes.

According to some embodiments, a portion of the conductive pattern may surround a corresponding light emitting layer among the light emitting layers in a closed form, and another portion of the conductive pattern may include an open end portion with respect to light emitting layers overlapping a boundary of the touch electrodes among the light emitting layers.

According to some embodiments, the main patterns may include first layer patterns and second layer patterns, which are in different layers with an insulating layer interposed therebetween.

According to some embodiments, the first layer patterns and the second layer patterns may respectively surround different light receiving layers.

According to some embodiments, the touch electrodes may include: a first sensing electrode including first sensing cells arranged while being spaced apart from each other in a first direction; a second sensing electrode on the same layer as the first sensing electrode, the second sensing electrode including second sensing cells arranged in a second direction intersecting the first direction; and a bridge electrode on a layer different from the layer on which the first sensing electrode and the second sensing electrode are located, the bridge electrode being connected between the first sensing cells adjacent to each other through a contact hole.

According to some embodiments, each of the first sensing cells and the second sensing cells may be formed by connecting the first layer patterns to each other through first connection patterns formed in the same layer as the first layer patterns.

According to some embodiments, a boundary of each of the first sensing cells and the second sensing cells may be formed by a cut-off end portion of each of the first connection patterns.

According to some embodiments, each of the first sensing cells and the second sensing cells may include a cross portion at which the first connection patterns are coupled to each other. End portions of the first connection patterns, which define a boundary of each of the first sensing cells and the second sensing cells, may be formed not to protrude from the cross portion in a plan view.

According to some embodiments, the bridge electrode may be formed by connecting the second layer patterns to each other through a second connection pattern formed in the same layer as the second layer patterns. According to some embodiments, the contact hole may be provided not to overlap the light emitting layers between adjacent light receiving layers. According to some embodiments, the first connection pattern and the second connection pattern, which overlap each other through the contact hole, may be electrically connected to each other. According to some embodiments, the first connection pattern may extend in a diagonal direction with respect to the first and second directions from a corresponding first layer pattern, and the second connection pattern may extend in the diagonal direction from a corresponding second layer pattern.

According to some embodiments, the bridge electrode may have a shape in which the second layer patterns adjacent to each other in the diagonal direction are connected to each other. According to some embodiments, the bridge electrode may not surround the light emitting layers in a plan view.

According to some embodiments, the touch electrodes may further include a dummy electrode between the first sensing electrode and the second sensing electrode, the dummy electrode being electrically insulated from the first sensing electrode and the second sensing electrode. According to some embodiments, each of the first sensing cells, the second sensing cells, and the dummy electrode may be formed by connecting the first layer patterns to each other through a first connection pattern formed in the same layer as the first layer patterns.

According to some embodiments, each of the light emitting elements may further include: a first pixel electrode provided between the circuit layer and a corresponding light emitting layer among the light emitting layers; and a second pixel electrode on the corresponding light emitting layer. According to some embodiments, each of the light receiving elements may further include: a first sensor electrode in the same layer as the first pixel electrode, the first sensor electrode being provided between the circuit layer and a corresponding light receiving layer among the light receiving layers; and a second sensor electrode on the corresponding light receiving layer. According to some embodiments, the second pixel electrode and the second sensor electrode may be integrally formed.

According to some embodiments, the pixel circuit layer may further include a bank layer in contact with a side surface of each of the light emitting layers and the light receiving layers to define a light emitting area and a light receiving area. According to some embodiments, the first layer pattern, the second layer pattern, the first connection pattern, and the second connection pattern may overlap the bank layer.

According to some embodiments, the display device may further include: a black matrix provided on the touch sensing layer, the black matrix including first openings overlapping the light emitting layers and second openings overlapping the light receiving layers; and a color filter provided on the touch sensing layer while filling at least one of the first opening or the second openings of the black matrix. According to some embodiments, the first layer pattern, the second layer pattern, the first connection pattern, and the second connection pattern may overlap the black matrix.

According to some embodiments, a display device includes: a base layer; a circuit layer provided on the base layer, the circuit layer including pixel circuits and sensor circuits; a pixel element layer provided on the circuit layer, the pixel element layer including light emitting elements respectively provided with light emitting layers and light receiving elements respectively provided with light receiving layers; an encapsulation layer covering the pixel element layer; a touch sensing layer on the encapsulation layer, the touch sensing layer including a conductive pattern forming sensing cells for sensing a touch and a bridge electrode; a black matrix provided on the touch sensing layer, the black matrix including first openings overlapping the light emitting layers and second openings overlapping the light receiving layers; and a color filter provided on the touch sensing layer while filling at least one of the first openings or the second openings, wherein the conductive pattern overlaps the black matrix while surrounding the second openings in a closed form in a plan view.

According to some embodiments, the conductive pattern may include: a first layer pattern forming the sensing cells, the first layer pattern surrounding each of portions of the second openings in the closed form; and a second layer pattern forming the bridge electrode, the second layer pattern surrounding each of another portions of the second openings in the closed form. According to some embodiments, the second layer pattern may be on a layer different from a layer on which the first layer pattern is located. According to some embodiments, a planar shape of the first layer pattern and a planar shape of the second layer pattern may be substantially the same.

According to some embodiments, a display device includes: a base layer; a circuit layer provided on the base layer, the circuit layer including pixel circuits and sensor circuits; a pixel element layer provided on the circuit layer, the pixel element layer including light emitting elements respectively connected to the pixel circuits and light receiving elements respectively connected to the sensor circuits; an encapsulation layer covering the pixel element layer; and a touch sensing layer on the encapsulation layer, the touch sensing layer including a conductive pattern forming touch electrodes for sensing a touch, wherein the light receiving elements include light receiving layers, wherein the conductive pattern includes main patterns surrounding at least a portion of each of the light receiving layers, and wherein the main patterns have a uniform shape in a plan view.

BRIEF DESCRIPTION OF THE DRAWINGS

Aspects of some embodiments will now be described more fully hereinafter with reference to the accompanying drawings; however, they may be embodied in different forms and should not be construed as limited to the embodiments set forth herein. Rather, these embodiments are provided so that this disclosure will be more thorough and more complete, and will more fully convey the scope of embodiments according to the present disclosure to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
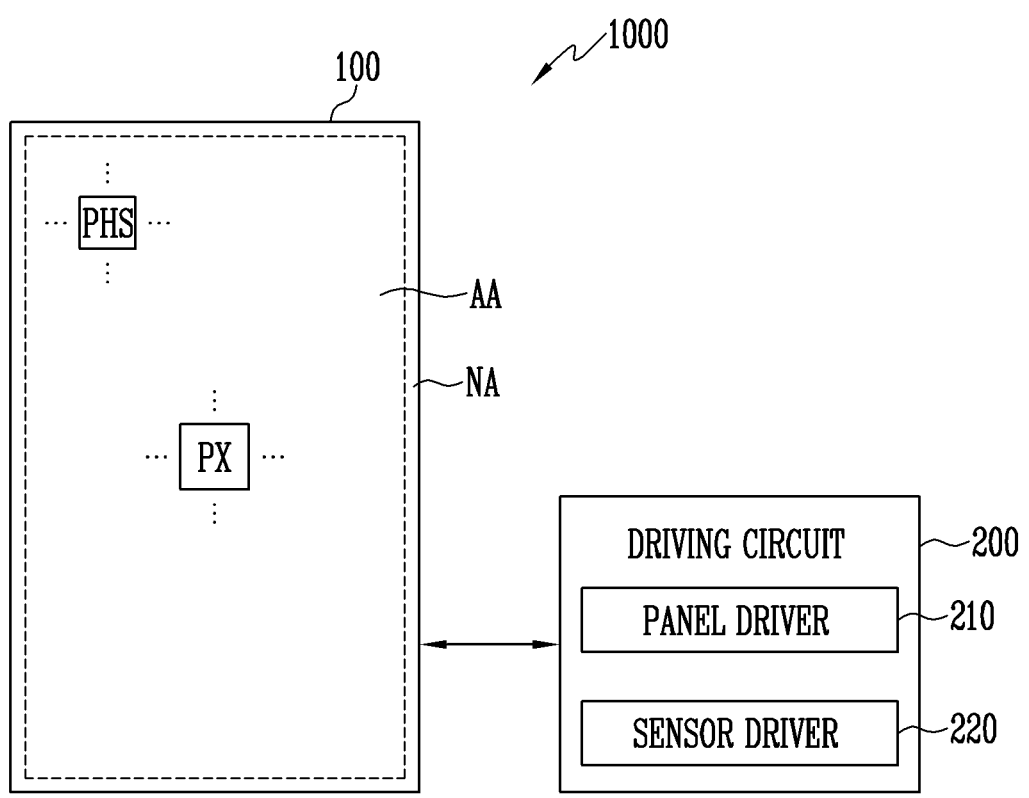
FIG. 1 is a block diagram illustrating a display device according to some embodiments of the present disclosure.

Hereinafter, aspects of some embodiments of the present disclosure will be described in more detail with reference to the accompanying drawings. Throughout the drawings, the same reference numerals are given to the same elements, and their duplicated descriptions will be omitted.

Embodiments disclosed in the present specification are provided only for illustrative purposes and for full understanding of the scope of the present disclosure by those skilled in the art. However, embodiments according to the present disclosure are not limited to the embodiments, and it should be understood that the present disclosure includes modification examples or change examples without departing from the spirit and scope of the present disclosure.

The drawings attached to the present specification are provided to easily explain the present disclosure, and the shapes shown in the drawings may be exaggerated and displayed as necessary to help understanding of the present disclosure, and thus embodiments according to the present disclosure are not limited to the drawings.

In the present specification, when it is determined that a detailed description of a known configuration or function related to the present disclosure may obscure the gist of the present disclosure, a detailed description thereof will be omitted as necessary.

FIG. 1 is a block diagram illustrating a display device in accordance with embodiments of the present disclosure.

Referring to FIG. 1, the display device 1000 may include a display panel 100 and a driving circuit 200. According to some embodiments, the driving circuit 200 may include a panel driver 210 and a sensor driver 220.

According to some embodiments, the display device 1000 may be implemented as a self-luminous display device including a plurality of self-luminous elements. For example, the display device 1000 may be an organic light emitting display device including organic light emitting elements. However, this is merely illustrative, and the display device 1000 may be a display device including inorganic light emitting elements or a display device including light emitting elements configured with a combination of inorganic and organic materials. Also, the display device 1000 may be implemented as a liquid crystal display device, a quantum dot display device, or the like.

The display device 1000 may be a flat panel display device, a flexible display device, a curved display device, a foldable display device, or a bendable display device. Also, the display device 1000 may be applied to a transparent display device, a head-mounted display device, a wearable display device, and the like.

The display panel 100 may include a display area AA and a non-display area NA. The display area AA may be an area in which a plurality of pixels PX (or may be referred to as sub-pixels) are provided. Each of the pixels PX may include at least one light emitting element. For example, the light emitting element may include a light emitting layer (or organic light emitting layer). A portion at which light is emitted by the light emitting element may be defined as a light emitting area. The display panel 100 drives the pixels PX, corresponding to image data input from the outside, thereby displaying an image in the display area AA.

The non-display area NA may be an area provided at the periphery of the display area AA. According to some embodiments, the non-display area NA may inclusively mean the other area except the display area AA on the display panel 100. For example, the non-display area NA may include a line area, a pad area, various dummy areas, and the like.

According to some embodiments, a photo sensor PHS (or may be referred to as a sensor pixel) may be included in the display area AA. The photo sensor PHS may include a light receiving element including a light receiving layer. The light receiving layer of the light receiving element may be arranged to be spaced apart from the light emitting layer of the light emitting element in the display area AA.

According to some embodiments, a plurality of photo sensors PHS may be distributed throughout the whole of the display area AA while being spaced apart from each other. However, this is merely illustrative, and only a portion of the display area AA may be set as a sensing area (e.g., a set or predetermined sensing area). The photo sensors PHS may be provided in the corresponding sensing area. In addition, the photo sensor PHS may be included even in at least a portion of the non-display area NA.

The photo sensors PHS may sense that light emitted from a light source (e.g., a light emitting element) is reflected by an external object (e.g., a finger of a user, or the like). For example, a fingerprint of the user may be sensed through the photo sensor PHS. Hereinafter, a case where the photo sensors PHS are used for fingerprint sensing is described as an example in the present disclosure. However, in various embodiments, the photo sensors PHS may sense various biometric information such as an iris.

The display device 1000 may include the panel driver 210 and the sensor driver 220. Although a case where the panel driver 210 and the sensor driver 220 are separated from each other is illustrated in FIG. 1, the technical scope of embodiments according to the present disclosure are not limited thereto. For example, at least a portion of the sensor driver 220 may be included in the panel driver 210, or operate in connection with the panel driver 210.

The panel driver 210 may scan the pixels PX of the display area AA, and supply a data signal corresponding to image data (or an image) to the pixels PX. The display panel 100 may display an image corresponding to the data signal.

According to some embodiments, the panel driver 210 may supply a driving signal for fingerprint sensing to the pixels PX. The driving signal may be provided to allow the pixels PX to operate as a light source for the photo sensor PHS by emitting light. According to some embodiments, the panel driver 210 may supply, to the photo sensor PHS, the driving signal for optical sensing and/or another driving signal. However, this is merely illustrative, and the driving signal for fingerprint sensing may be provided by the sensor driver 220.

The sensor driver 220 may detect biometric information such as the fingerprint of the user, based on a sensing signal received from the photo sensors PHS. According to some embodiments, the sensor driver 220 may supply the driving signal to the photo sensor PHS and/or the pixel PX.

According to some embodiments, the display panel 100 may further include a touch sensing layer for touch sensing on the display area AA. According to some embodiments, the sensor driver 220 may detect a touch position of a finger or the like, based on a sensing signal provided from the touch sensing layer.

Figure 2:
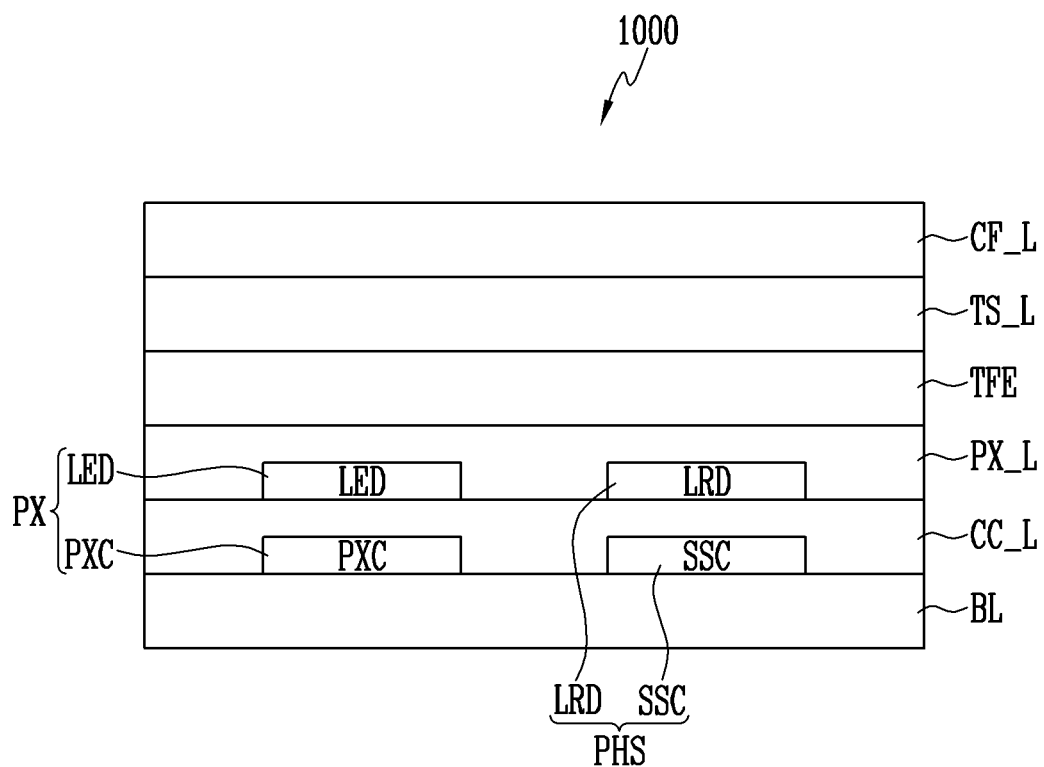
FIG. 2 is a sectional view schematically illustrating an example of a portion of the display device shown in FIG. 1.

FIG. 2 is a sectional view schematically illustrating an example of a portion of the display device shown in FIG. 1.

Referring to FIGS. 1 and 2, the display device 1000 (e.g., the display panel 100) may include a base layer BL, a circuit layer CC_L, a pixel element layer PX_L, an encapsulation layer TFE, and a touch sensing layer TS_L. The display device 1000 may further include a color filter layer CF_L located on the touch sensing layer TS_L.

The base layer BL may be made of an insulative material such as glass or resin. The base layer BL may be made of a material having flexibility to be bendable or foldable, and have a single-layer structure or a multi-layer structure.

The circuit layer CC_L including a pixel circuit PXC and a sensor circuit SSC may be provided on the base layer BL. The circuit layer CC_L may include a semiconductor layer, a plurality of conductive layers, and a plurality of insulating layers, which will be described later with reference to FIG. 7 and the like.

The pixel circuit PXC may be formed to drive an upper light emitting element LED, and the sensor circuit SSC may be formed to drive an upper light receiving element LRD. According to some embodiments, the pixel circuit PXC and the sensor circuit SSC may be provided through the same process.

The pixel element layer PX_L may be provided on the circuit layer CC_L. The pixel element layer PX_L may include the light emitting element LED and the light receiving element LRD. The light emitting element Led may include a light emitting layer. The light emitting layer of the light emitting element LED may emit light, based on a current provided from the pixel circuit PXC. The light receiving element LRD may include a light receiving layer. The light receiving layer of the light receiving element LRD may emit electrons by reacting light in a specific wavelength band. Accordingly, an intensity of light may be sensed. In some embodiments, a light emitting area and a light receiving area may be defined with respect with the light emitting layer and the light receiving layer. The pixel element layer PX_L may include electrode layers, the light emitting layer, the light receiving layer, and a bank layer, which will be described later with reference to FIG. 7 and the like.

According to some embodiments, each of the light emitting layer and the light receiving layer may include an organic material. However, this is merely illustrative, and the configurations of the light emitting element LED and the light receiving element LRD are not limited thereto.

The pixel circuit PXC and the light emitting element LED may constitute a pixel PX, and the sensor circuit SSC and the light receiving element LRD may constitute a photo sensor PHS.

The encapsulation layer TFE may be provided on the pixel element layer PX_L. The encapsulation layer TFE may be provided as a single layer, but be provided as a multi-layer. According to some embodiments, the encapsulation layer TFE may have a stack structure in which an inorganic material, an organic material, and an inorganic material are sequentially stacked. An uppermost layer of the encapsulation layer may be formed of an inorganic material.

The touch sensing layer TS_L may be provided on the encapsulation layer TFE. The touch sensing layer TS_L may include a conductive pattern and an insulating layer, which form touch electrodes for touch sensing. According to some embodiments, the conductive pattern of the touch sensing layer TS_L may be configured as a double layer formed with the insulating layer interposed therebetween. The conductive pattern of the touch sensing layer TSL may be arranged to avoid the light emitting area and the light receiving area so as to ensure relatively higher image quality and light receiving amount.

The color filter layer CF_L may be provided on the touch sensing layer TS_L. According to some embodiments, the color filter layer CF_L may include a black matrix and a color filter.

The black matrix may include openings overlapping the light emitting layer and the light receiving layer. The black matrix may overlap the bank layer of the pixel element layer PX_L.

The color filter may allow light emitted from the light emitting element LED to selectively pass therethrough. For example, the color filter may be determined according to a color of light emitted from the light emitting area. For example, when green light is output from the light emitting area, a green color filter may be arranged to overlap the light emitting area. According to some embodiments, a color filter overlapping the light receiving element LRD may be set regardless of a color of light emitted from an adjacent pixel PX.

Figure 3:
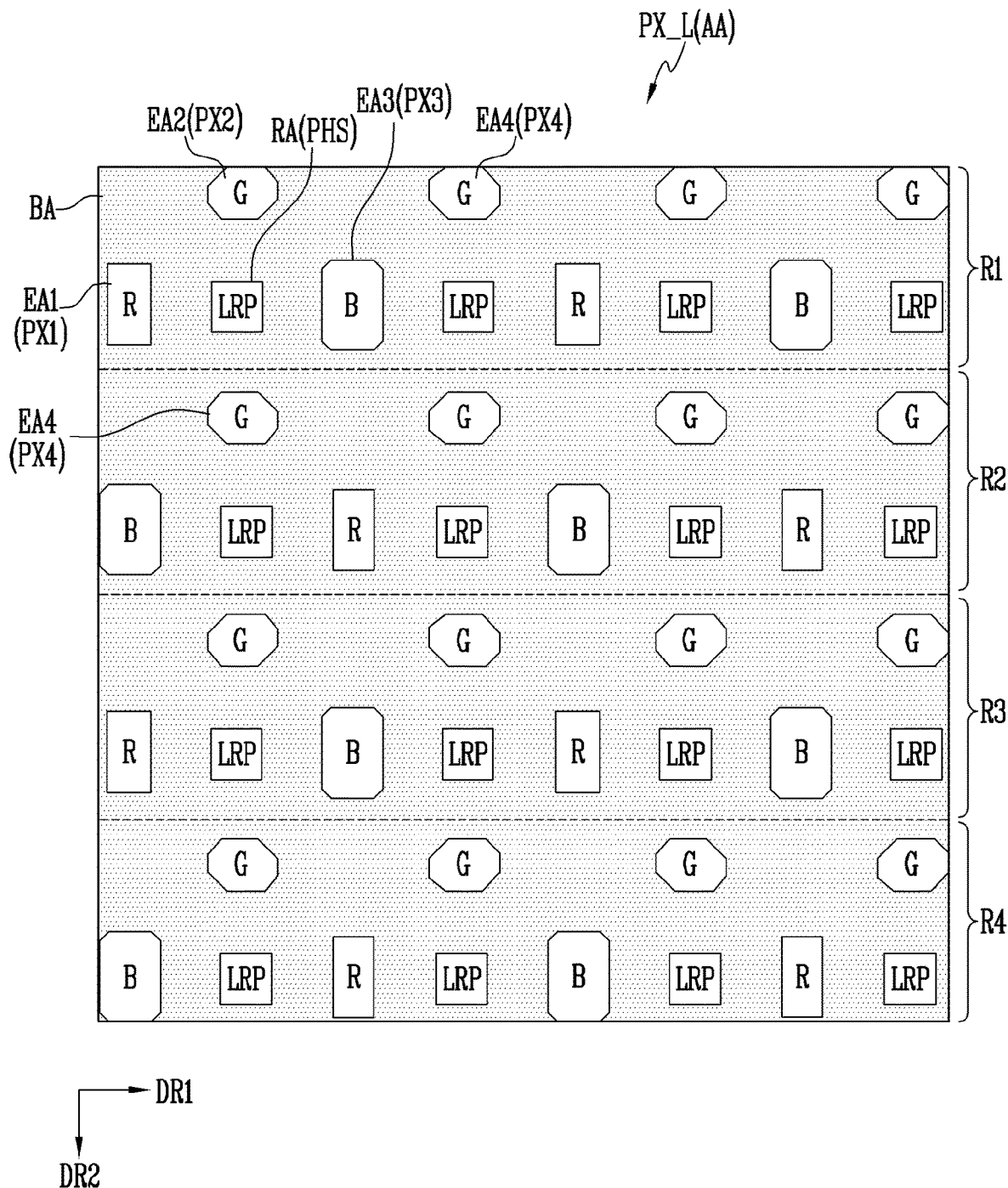
FIG. 3 is a plane view illustrating an example of a pixel element layer of the display device shown in FIG. 2.

FIG. 3 is a plane view illustrating an example of the pixel element layer of the display device shown in FIG. 2.

Referring to FIGS. 2 and 3, pixels PX1, PX2, PX3, and PX4 and photo sensors PHS may be located in the display area AA of the display device 1000.

Only the pixel element layer PX_L is illustrated in FIG. 3. For convenience of description, it may be understood that light emitting areas EA1, EA2, EA3, and EA4 corresponding to light emitting layers and light receiving areas RA corresponding to light receiving layers correspond to the pixels PX1, PX2, PX3, and PX4 and the photo sensors PHS, respectively.

A first pixel PX1, a second pixel PX2, and a third pixel PX3 may respectively emit first color light, second color light, and third color light. The first color light, the second color light, and the third color light may be different color lights, and each of the first color light, the second color light, and the third color light may be light of one of red, green, and blue. According to some embodiments, a fourth pixel PX4 may emit the same color light as the second pixel PX2. For example, the first pixel PX1 may be defined as a red pixel R, the second and fourth pixels PX2 and PX2 may be defined as green pixels G, and the third pixel PX3 may be defined as a blue pixel B. However, this is merely illustrative, and the colors of lights emitted from the first to fourth pixels PX1 to PX4 are not limited thereto.

According to some embodiments, pixels PX1, PX2, PX3, and PX4 may be arranged roughly in a first direction DR1 in an order of the first pixel PX1 emitting red light, the second pixel PX2 emitting green light, the third pixel PX3 emitting blue light, and the fourth pixel PX4 emitting green light on a first pixel row R1 (or first horizontal line) controlled by the same scan line. According to some embodiments, a light receiving area RA of a photo sensor PHS may be located between a first light emitting area EA1 of the first pixel PX1 and a third light emitting area EA3 of the third pixel PX3. The light receiving area RA may correspond to a light receiving element LRD (e.g., a light receiving part LRP). Therefore, arrangements of first to fourth light emitting areas EA1 to EA4 do not accord with each other. For example, a second light emitting area EA2 of the second pixel PX2 and a fourth light emitting area EA4 of the fourth pixel PX4 may be located relatively upwardly as compared with the first to third light emitting areas EA1 and EA3.

According to some embodiments, the photo sensor PHS located on the first pixel row R1 may be commonly connected to the scan line connected to the first to fourth pixels PX1 to PX4 of the first pixel row R1. However, this is merely illustrative, and the photo sensor PHS located on the first pixel row R1 may be controlled by another signal line different from the scan line connected to the first to fourth pixels PX1 to PX4.

According to some embodiments, an area of the light receiving area RA may be smaller than an area of each of the first to fourth light emitting areas EA1 to EA4. Thus, image quality deterioration according to insertion of the light receiving area RA can be minimized.

However, this is merely illustrative, and the positions, areas, shapes, and the like of the first to fourth light emitting areas EA1 to EA4 and the light receiving areas RA are not limited thereto.

Pixels PX1, PX2, PX3, and PX4 may be arranged roughly in the first direction DR1 in an order of the third pixel PX3, the fourth pixel PX4, the first pixel PX1, and the second pixel PX2 on a second pixel row R2 controlled by a second scan line.

A pixel arrangement of the first pixel row R1 and a pixel arrangement of the second pixel row R2 may be alternately repeated with respect to a second direction DR2 intersecting the first direction DR1. The second direction DR2 may be a direction perpendicular to the first direction DR1. For example, a pixel arrangement of a third pixel row R3 may be substantially identical to the pixel arrangement of the first pixel row R1. A pixel arrangement of a fourth pixel row R4 may be substantially identical to the pixel arrangement of the second pixel row R2. However, this is merely illustrative, and the arrangements of the pixels PX1 to PX4 are not limited thereto.

Meanwhile, although a case where an area of the third light emitting area EA3 of the third pixel PX3 as a blue pixel B is greater than areas of the other light emitting areas EA1, EA2, and EA4 is illustrated in FIG. 3, embodiments according to the present disclosure are not limited thereto.

According to some embodiments, the photo sensors PHS may sense lights having wavelengths in bands equal or similar to each other or lights having wavelengths in bands different from each other. For example, the photo sensors PHS may sense light in a wavelength band corresponding to one of red light, green light, and blue lights.

According to some embodiments, the photo sensor PHS and the light receiving area RA may be arranged at a ratio of 1:2 with respect to the pixels PX1, PX2, PX3, and PX4 and the light emitting areas EA1, EA2, EA3, and EA4. For example, the first pixel PX1, the second pixel PX2, and one photo sensor PHS adjacent thereto may constitute a first unit, and the third pixel PX3, the fourth pixel PX4, and another photo sensor PHS adjacent thereto may constitute a second unit.

Therefore, according to the arrangement of the pixels PX1, PX2, PX3, and PX4 and the photo sensor PHS, the first unit and the second unit may be alternately arranged in each of the first direction DR1 and the second direction DR2.

According to some embodiments, a bank area BA may be defined by a bank layer (or pixel defining layer) partitioning each of the light receiving area RA and the light emitting areas EA1, EA2, EA3, and EA4. For example, the bank area BA may include a light absorbing material, or have a light absorber coated thereon, to absorb light introduced from the outside. The conductive pattern of the touch sensing layer TS_L may be arranged to overlap the bank area BA.

Figure 4:
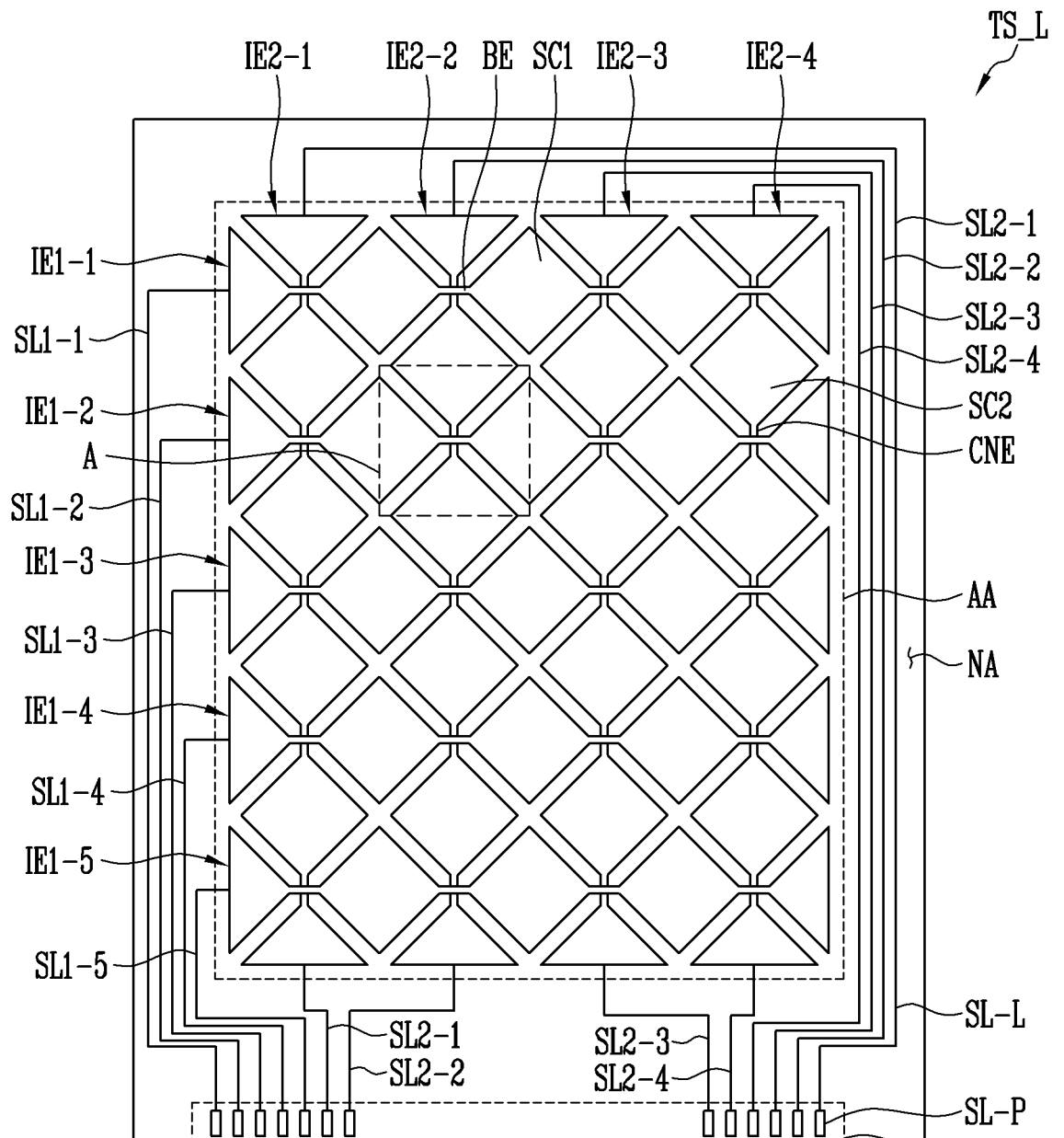
FIG. 4 is a conceptual view illustrating an example of a touch sensing layer of the display device shown in FIG. 2.

FIG. 4 is a conceptual view illustrating an example of the touch sensing layer of the display device shown in FIG. 2.

Referring to FIGS. 2 and 4, the touch sensing layer TS_L may include first sensing electrodes IE1-1 to IE1-5 and second sensing electrodes IE2-1 to IE2-4 in the display area AA. Also, the touch sensing layer TS_L may include first signal lines SL1-1 to SL1-5 connected to the first sensing electrodes IE1-1 to IE1-5 and second signal lines SL2-1 to SL2-4 connected to the second sensing electrodes IE2-1 to IE2-4 in the non-display area NA.

The first sensing electrodes IE1-1 to IE1-5 and the second sensing electrodes IE2-1 to IE2-4 intersect each other. Each of the first sensing electrodes IE1-1 to IE1-5 may extend in the first direction DR1. Each of the second sensing electrodes IE2-1 to IE2-4 may extend in the second direction DR2. The touch sensing layer TS_L of the display area AA may sense an external input by using a mutual cap method and/or a self-cap method.

Each of the first sensing electrodes IE1-1 to IE1-5 may include first sensing cells SC1 and bridge electrodes BE. Each of the second sensing electrodes IE2-1 to IE2-4 may include second sensing cells SC2 and connection electrodes CNE.

Although the first sensing cell SC1 and the second sensing cell SC2, which have a rhombic shape, are illustrated in FIG. 4, this is a conceptual shape, and the first sensing cell SC1 and the second sensing cell SC2 may be implemented in various other shapes, and embodiments are not limited to the embodiments illustrated in FIG. 4.

According to some embodiments, the first sensing electrodes IE1-1 to IE1-5 and the second sensing electrodes IE2-1 to IE2-4 may be formed in a mesh pattern. For example, a conductive pattern forming the first sensing electrodes IE1-1 to IE1-5 and the second sensing electrodes IE2-1 to IE2-4 may be arranged to avoid the light emitting area and the light receiving area.

First sensing cells SC1 in one first sensing electrode may be arranged along the first direction DR1, and second sensing cells in one second sensing electrode may be arranged along the second direction DR2. Each bridge electrode BE may connect adjacent first sensing cells SC1 to each other. Each connection electrode CNE may connect adjacent second sensing cells SC2 to each other. For convenience of understanding, it is described that a second sensing electrode is divided into connection electrodes CNE and second sensing cells SC2. However, it may be understood that the connection electrode CNE is a portion of the second sensing cells SC2.

According to some embodiments, the first sensing cell SC1, the second sensing cell SC2, and the connection electrode CNE may be located or formed in the same layer, and the bridge electrode BE may be located or formed in a layer different from the layer in which the first sensing cell SC1, the second sensing cell SC2, and the connection electrode CNE are located. Accordingly, the first sensing electrodes IE1-1 to IE1-5 and the second sensing electrodes IE2-1 to IE2-4 may not be short-circuited with each other, or instances of short circuits may be reduced or prevented.

The first signal lines SL1-1 to SL1-5 may be respectively connected to one ends of the first sensing electrodes IE1-1 to IE1-5. According to some embodiments, the second signal lines SL2-1 to SL2-4 may be connected both ends of the second sensing electrodes IE2-1 to IE2-4. The first signal lines SL1-1 to SL1-5 and the second signal lines SL2-1 to SL2-4 may extend in the non-display area NA.

According to some embodiments, the first signal lines SL1-1 to SL1-5 may be connected to both ends of the first sensing electrodes IE1-1 to IE1-5. According to some embodiments, the second signal lines SL2-1 to SL2-4 may be respectively connected to only one ends of the second sensing electrodes IE2-1 to IE2-4.

The first signal lines SL1-1 to SL1-5 and the second signal lines SL2-1 to SL2-4 may include line parts SL-L and the pad part SL-P. The pad parts SL-P may be connected to pads aligned in a pad area NDA-PD.

However, this is merely illustrative, and the planar shape of the touch sensing layer TS_L formed in the display area AA is not limited thereto.

According to some embodiments, the touch sensing layer TS_L may further include a dummy electrode (or optical dummy electrode) arranged to be spaced apart from the first sensing electrodes IE1-1 to IE1-5 and the second sensing electrodes IE2-1 to IE2-4.

Figure 5:
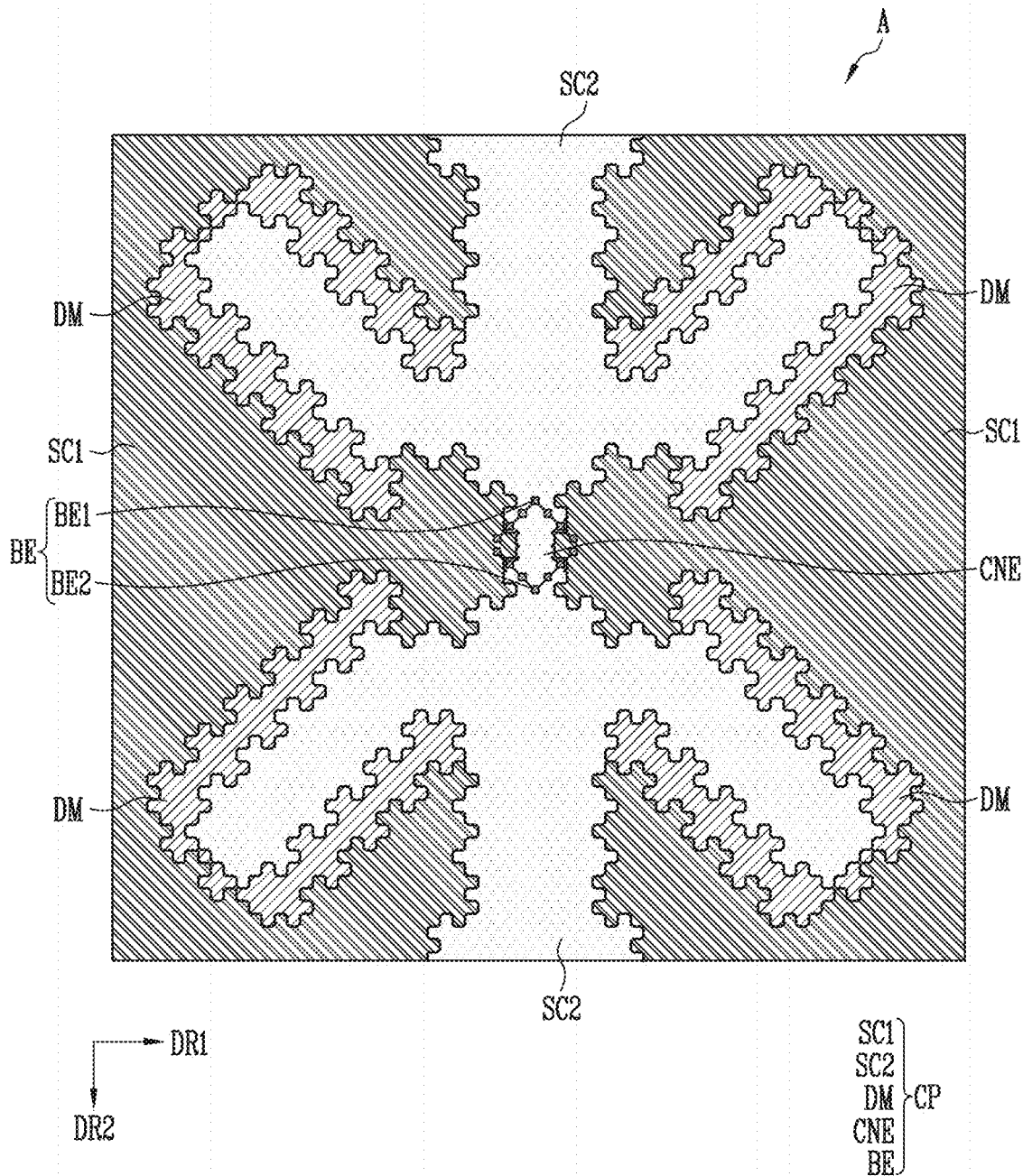
FIG. 5 is an enlarged view illustrating an example of area A of the touch sensing layer shown in FIG. 4.

FIG. 5 is an enlarged view illustrating an example of area A of the touch sensing layer shown in FIG. 4.

Referring to FIGS. 3, 4, and 5, the touch sensing layer TS_L may include a conductive pattern CP forming the first sensing cells CS1, the second sensing cells SC2, the bridge electrode BE, and the connection electrode CNE. The touch sensing layer TS_L may further include a dummy electrode DM.

A boundary of each of the above-described components shown in FIG. 5 is to be understood as that adjacent components are electrically and physically cut off from or spaced apart from each other. For example, the first sensing cell SC1, the second sensing cell SC2, and the dummy electrode DM are arranged to be spaced apart from each other, and are not electrically/physically connected to each other.

The first sensing cells SC1 and the bridge electrodes BE may form the first sensing electrodes IE1-1 to IE1-5. The second sensing cells SC2 and the connection electrodes CNE may form the second sensing electrodes IE2-1 to IE2-4.

According to some embodiments, the conductive pattern CP forming the first sensing cell SC1, the second sensing cell SC2, the bridge electrode BE, the connection electrode CNE, and the dummy electrode DE may have a mesh pattern. The conductive pattern CP may be arranged to avoid the light emitting areas EA1, EA2, EA3, and EA4 and the light receiving area RA. For example, the conductive pattern CP may form a mesh overlapping the light receiving area RA (e.g., the light receiving part LRP). In other words, the conductive pattern CP may have fine lines with a closed loop shape, which surrounds the light receiving area RA.

In FIG. 5, the reason why a boundary of each component is not shown smoothly is that it is represented that the fine lines of the conductive pattern CP are arranged to avoid the light emitting areas EA1, EA2, EA3, and EA4 and the light receiving area RA.

The first sensing cells SC1 may be arranged in the first direction DR1. Also, the first sensing cells SC1 may be spaced apart from each other by the second sensing cells SC2. The first sensing cells SC1 at both sides of the second sensing cell SC2 may be electrically connected to each other by the bridge electrode BE.

The bridge electrode BE may be located in a layer different from a layer in which the first sensing cells SC1 are located. According to some embodiments, the bridge electrode BE may be formed by the conductive pattern CP surrounding light receiving areas (e.g., set or predetermined light receiving areas) RA. The bridge electrode BE may include a first bridge electrode BE1 and a second bridge electrode BE2. The bridge electrode BE formed with two patterns spaced apart from each other may decrease resistance of a corresponding sensing electrode.

The second sensing cells SC2 may be arranged in the second direction DR2. Also, the second sensing cells SC2 may be integrally formed. For example, the second sensing cells SC2 may be integrally connected to the connection electrode CNE formed through the same process as the second sensing cells. According to some embodiments, as shown in FIG. 5, each second sensing cell SC2 may have a shape including three branches. However, this is merely illustrative, and the planar layout shape of the second sensing cell SC2 is not limited thereto.

The dummy electrode DM may be located between the first sensing cell SC1 and the second sensing cell SC2. The dummy electrode DM is electrically and physically separated from the first sensing cell SC1 and the second sensing cell SC2. The dummy electrode DM may be formed through the same process as the first sensing cell SC1 and the second sensing cell SC2, and include the same material as the first sensing cell SC1 and the second sensing cell SC2. The dummy electrode DM is arranged, so that the visibility of a boundary between the first sensing cell SC1 and the second sensing cell SC2 can be reduced.

In addition, a distance between the first sensing cell SC1 and the second sensing cell SC2 can be secured by the dummy electrode DM. Accordingly, a short-circuit possibility between the first sensing cell SC1 and the second sensing cell SC2 and a parasitic capacitance can be reduced. Although a case where the dummy electrode DM is arranged only in a partial area between the first sensing cell SC1 and the second sensing cell SC2 is illustrated in FIG. 5, embodiments according to the present disclosure are not limited thereto. The position, shape, size, and the like of the dummy electrode DM may be variously modified.

Figure 6:
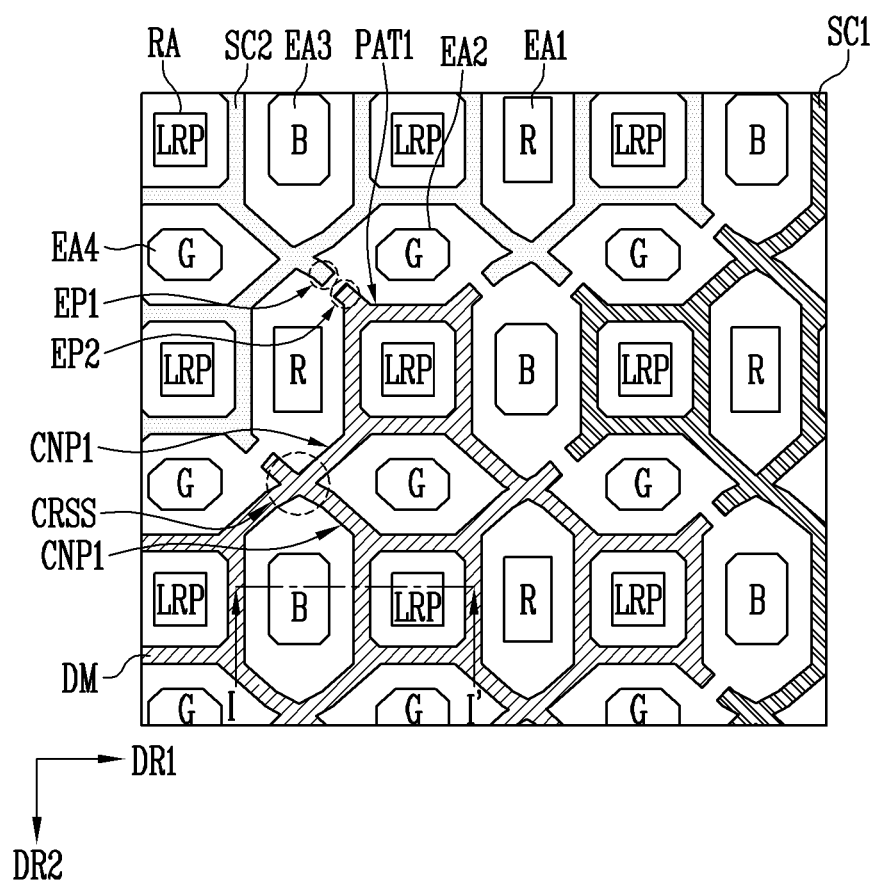
FIG. 6 is a plan view illustrating an example of a portion of the touch sensing layer shown in FIG. 5, which is on the pixel element layer shown in FIG. 2.

FIG. 6 is a plan view illustrating an example of a portion of the touch sensing layer shown in FIG. 5, which is located on the pixel element layer shown in FIG. 2.

Referring to FIGS. 2, 3, 5, and 6, the touch sensing layer TS_L may include a first sensing cell SC1, a second sensing cell SC2, and a dummy electrode DM.

On the plan view shown in FIG. 6, it may be understood that the other portion except the first to fourth light emitting areas EA1 to EA4 and the light receiving area RA is a bank area BA. In addition, FIG. 6 shows an enlarged example of an area including boundaries of the first sensing cell SC1, the second sensing cell SC2, and the dummy electrode DM.

The first sensing cell SC1, the second sensing cell SC2, and the dummy electrode DM may be located on the same layer.

The conductive pattern CP forming the first sensing cell SC1, the second sensing cell SC2, and the dummy electrode DM may include a main pattern PAT1 surrounding the light receiving part LRP (may be understood as one substantially identical to the light receiving layer of the light receiving element LRD) in a closed form. Also, the conductive pattern CP may further include a first connection pattern CNP1 extending from the main pattern PAT1.

Each of the first sensing cell SC1, the second sensing cell SC2, and the dummy electrode DM may be formed by connection between the main pattern PAT1 and the first connection pattern CNP1.

According to some embodiments, when viewed on a plane, the main pattern PAT1 may be a pattern in the closed form, which does not overlap the light receiving part LRP. The main pattern PAT1 may be arranged to surround each of light receiving parts LRP of all light receiving elements LRD. According to some embodiments, main patterns PAT1 may have a substantially uniform planar shape. Therefore, an amount of light reflected by the main pattern PAT1 and then incident onto the light receiving part LRP may become substantially uniform for each of the light receiving elements LRD.

However, this is merely illustrative, and the main pattern PAT1 may be arranged to surround each of light receiving parts of light receiving elements LRD which are 90% or more of all the light receiving elements LRD. For example, unlike FIG. 6, the light receiving element LRD may be arranged in an outermost portion of the display area AA and/or a portion of the display area AA, which corresponds to a camera lens or the like, due to a design of the display device. That is, a portion at which the main pattern PAT1 does not surround the light receiving part LRP may exist structurally unavoidably. Except such a portion, the main pattern PAT1 may surround the light receiving part LRP with respect to all available light receiving elements LRD.

According to some embodiments, the main pattern PAT1 may have a quadrangular ring shape surrounding the light receiving part LRP. However, this is merely illustrative, and the shape of the main pattern PAT1 is not limited thereto. The main pattern PAT1 may have various closed loop shapes according to a design.

The first connection pattern CNP1 may extend in a diagonal direction with respect to the first direction DR1 and the second direction DR2 from the main pattern PAT1. For example, each first connection patterns CNP1 may extend toward another main pattern PAT1 adjacent in a diagonal direction to each main pattern PAT1. First connection patterns CNP1 may be coupled to each other at a middle point between adjacent main patterns PAT1. The middle point may be defined as a cross portion CRSS.

The main pattern PAT1 and the first connection pattern CNP1 may be arranged to avoid the light emitting areas EA1 to EA4 and the light receiving areas RA. The main pattern PAT1 and the first connection pattern CNP1 may be arranged to overlap the bank area BA.

A first sensing cell SC1 may be formed by connection between main patterns PAT1 and first connection patterns CNP1 in an area (e.g., a set or predetermined area). Also, in an area separated from the first sensing cell SC1, a second sensing cell SC2 may be formed by connection between main patterns PAT1 and first connection patterns CNP1. Likewise, a dummy electrode DM may be formed by connection between main patterns PAT1 and first connection patterns CP1 in an area different from areas in which the first sensing cell SC1 and the second sensing cell SC2 are formed.

According to some embodiments, a portion of the conductive pattern CP may surround a corresponding light emitting area (e.g., a corresponding light emitting layer) in a closed form due to connection between main patterns PAT1 and first connection patterns CNP1. For example, the conductive pattern CP may surround a light emitting area (e.g., a set or predetermined light emitting area) in a hexagonal ring shape.

The first sensing cell SC1, the second sensing cell SC2, and the dummy electrode DM may be arranged to be spaced apart from each other. A boundary of each of the first sensing cell SC1, the second sensing cell SC2, and the dummy electrode DM may be defined by end portions EP1 and EP2 of the first connection pattern CNP1. For example, a portion of a first connection pattern CNP1, which corresponds to a boundary of touch electrodes (e.g., the first sensing cell SC1, the second sensing cell SC2, and the dummy electrode DM) may be removed, so that cut-off end portions EP1 and EP2 are formed. In FIG. 6, a first end portion EP1 may be included in the second sensing cell SC2, and a second end portion EP2 may be included in the dummy electrode DM.

The end portions EP1 and EP2 are not formed in the main pattern PAT1 but may be formed only in the first connection pattern CNP1. Therefore, the conductive pattern CP surrounding the pixels PX1, PX2, PX3, and PX4, which corresponds to the boundary of each of the first sensing cell SC1, the second sensing cell SC2, and the dummy electrode DM, may include an end portion (e.g., EP1 and EP2) in an open form with respect to each of the light emitting areas EA1, EA2, EA3, and EA4 (or light emitting layers).

As described above, the display device 1000 including the light receiving elements LRD between the light emitting elements LED may include main patterns PAT1 in which the conductive pattern CP of the touch sensing layer TS_L, which overlaps the bank area BA, surrounds light receiving parts LRP (e.g., light receiving layers of light receiving elements LRD) in a closed form having the same shape. In addition, the first sensing cell SC1, the second sensing cell SC2, and the dummy electrode DP may be separated from each other by removing portions of the first connection patterns CNP1 at the outside of the main patterns PAT1. Thus, amounts of lights reflected by the main patterns PAT1 having the uniform shape and then incident onto the light receiving parts LRP may become substantially uniform for every light receiving element LRD, and the reliability of the photo sensor PHS can be improved.

Figure 7:
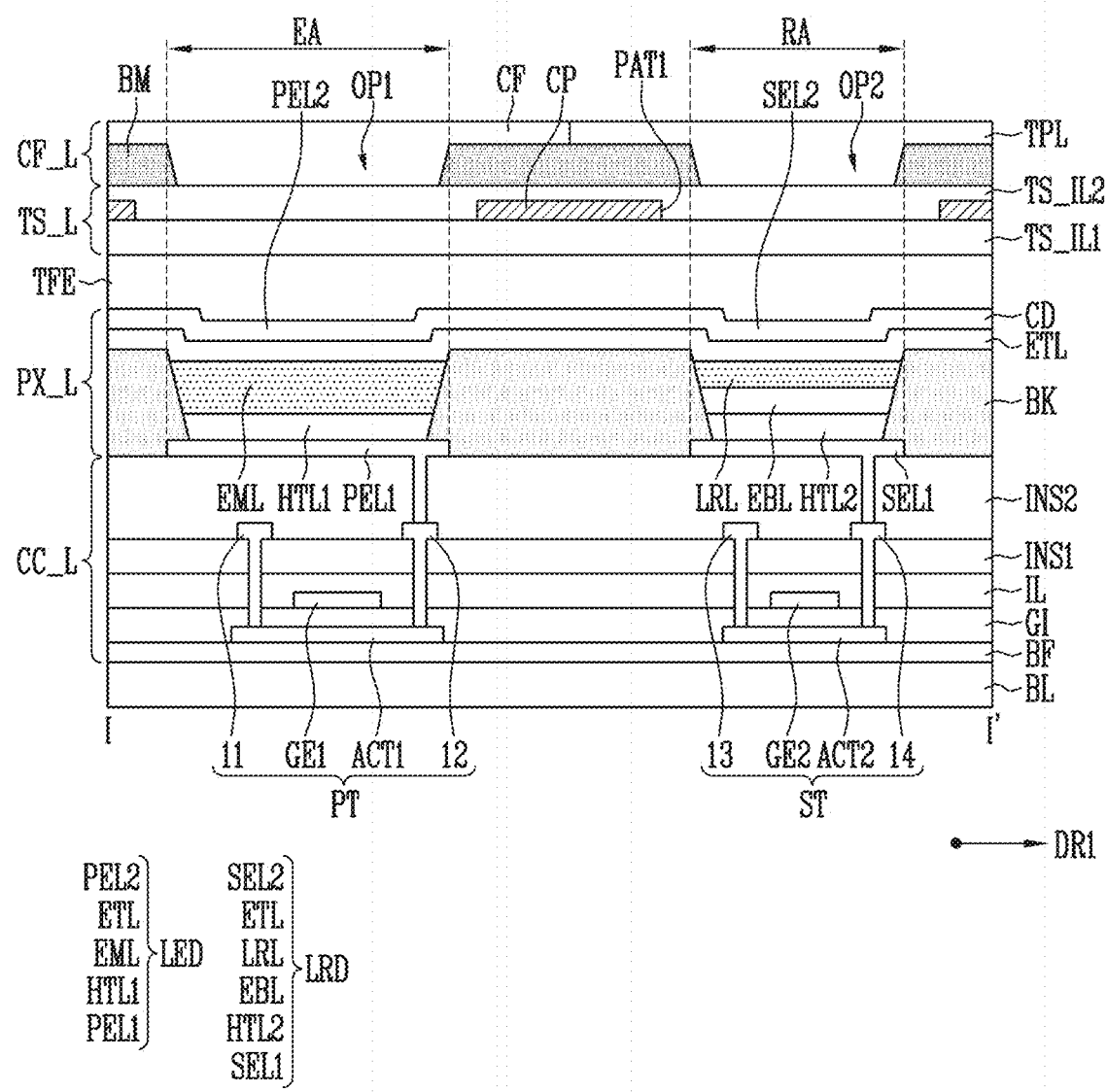
FIG. 7 is a sectional view illustrating an example taken along the line I-I' shown in FIG. 6.

FIG. 7 is a sectional view illustrating an example taken along line I-I' shown in FIG. 6.

Referring to FIGS. 2, 3, 6, and 7, the display area AA of the display device 1000 may include the base layer BL, the circuit layer CC_L, the pixel element layer PX_L, the encapsulation layer TFE, the touch sensing layer TS_L, and the color filter layer CF_L.

The sectional view shown in FIG. 7 shows a partial configuration of the pixel PX and the photo sensor PHS.

The base layer BL may be made of an insulative material such as glass or resin. The base layer BL may be made of a material having flexibility to be bendable or foldable, and have a single-layer structure or a multi-layer structure.

The circuit layer CC_L including the pixel circuit PXC and the sensor circuit SSC may be provided on the base layer BL. The circuit layer CC_L may include a semiconductor layer, a plurality of conductive layers, and a plurality of insulating layers, which will be described later.

A buffer layer BF may be formed on the base layer BL. The buffer layer BF may prevent an impurity from being diffused into transistors PT and ST. The buffer layer BF may be omitted according to according to the material and process conditions of the base layer BL.

A first active pattern ACT1 and a second active pattern ACT2 may be provided on the buffer layer BF. The first active pattern ACT1 and the second active pattern ACT2 may be formed of a semiconductor material. Each of the first active pattern ACT1 and the second active pattern ACT2 may include a source region, a drain region, and a channel region provided between the source region and the drain region.

A gate insulating layer GI may be provided over the first active pattern ACT1 and the second active pattern ACT2. The gate insulating layer GI may be an inorganic insulating layer made of an inorganic material.

A first gate electrode GE1 and a second gate electrode GE2 may be provided on the gate insulating layer GI. The first gate electrode GE1 may be formed to cover a region corresponding to the channel region of the first active pattern ACT1. The second gate electrode GE2 may be formed to cover a region corresponding to the channel region of the second active pattern ACT2.

The first gate electrode GE1 and the second gate electrode GE2 may be made of a metal. For example, the first gate electrode GE1 and the second gate electrode GE2 may be made of at least one of metals such as gold (Au), silver (Ag), aluminum (Al), molybdenum (Mo), chromium (Cr), titanium (Ti), nickel (Ni), neodymium (Nd), or copper (Cu), or alloys thereof. Also, each of the first gate electrode GE1 and the second gate electrode GE2 may be formed as a single layer or a multi-layer in which two or more of the metals and the alloys are stacked.

An interlayer insulating layer IL may be provided over the first gate electrode GE1 and the second gate electrode GE2. The interlayer insulating layer IL may be an inorganic insulating layer made of an inorganic material. The inorganic material may include polysiloxane, silicon nitride, silicon oxide, silicon oxynitride, and the like.

A conductive layer (e.g., a set or predetermined conductive layer) may be provided on the interlayer insulating layer IL. The conductive layer may include an electrode (e.g., a predetermined electrode), a signal line (e.g., a set or predetermined signal line), and the like.

A first insulating layer INS1 may be provided on the interlayer insulating layer IL. The first insulating layer INS may be an inorganic insulating layer made of an inorganic material. The inorganic material may include polysiloxane, silicon nitride, silicon oxide, silicon oxynitride, and the like.

A first source electrode 11, a first drain electrode 12, a second source electrode 13, and a second drain electrode 14 may be provided on the first insulating layer INS1. Although a case where a pixel transistor PT and a sensor transistor ST are implemented with a P-type transistor is illustrated in FIG. 7, source and drain electrodes may be changed according to a type of the transistor.

The first source electrode 11 and the first drain electrode 12 may be respectively in contact with the source region and the drain region of the first active pattern ACT1 through contact holes formed in the first insulating layer INS, the interlayer insulating layer IL, and the gate insulating layer GI. The first source electrode 11, the first drain electrode 12, the first gate electrode GE1, and the first active pattern ACT1 may constitute the pixel transistor PT.

The second source electrode 13 and the second drain electrode 14 may be respectively in contact with the source region and the drain region of the second active pattern ACT2 through contact holes formed in the first insulating layer INS, the interlayer insulating layer IL, and the gate insulating layer GI. The second source electrode 13, the second drain electrode 14, the second gate electrode GE2, and the second active pattern ACT2 may constitute the sensor transistor ST.

The source electrodes 11 and 13 and the drain electrodes 12 and 14 may be made of a metal. For example, the source electrodes 11 and 13 and the drain electrodes 12 and 14 may be made of at least one of metals such as gold (Au), silver (Ag), aluminum (Al), molybdenum (Mo), chromium (Cr), titanium (Ti), nickel (Ni), neodymium (Nd), or copper (Cu), or alloys thereof.

According to some embodiments, a passivation layer may be provided over the source electrodes 11 and 13 and the drain electrodes 12 and 14. The passivation layer may be an inorganic insulating layer made of an inorganic material. The inorganic material may include polysiloxane, silicon nitride, silicon oxide, silicon oxynitride, and the like.

A second insulating layer INS2 may be provided over the source electrodes 11 and 13 and the drain electrodes 12 and 14 (or the passivation layer). According to some embodiments, the second insulating layer INS2 may be an organic insulating layer made of an organic material. The organic material may include an organic insulating material such as a polyacryl-based compound, a polyimide-based compound, a fluorine-based compound such as Teflon, or a benzocyclobutene-based compound. The second insulating layer INS2 may be an inorganic insulating layer made of an inorganic material.

Although a case where the second insulating layer INS2 is provided on the first insulating layer INS1 is illustrated in FIG. 7, the arrangement of the insulating layers may be changed. For example, only the passivation layer may be provided over the source and drain electrodes 11, 12, 13, and 14, and a first pixel electrode PEL1 and a first sensor electrode SEL1 may be provided on the passivation layer. Alternatively, an additional conductive layer and a third insulating layer covering the same may be provided on the second insulating layer INS2, and the first pixel electrode PEL1 and the first sensor electrode SEL1 may be formed on the third insulating layer.

The pixel element layer PX_L may be provided on the circuit layer CC_L. The pixel element layer PX_L may include a light emitting element LED connected to the pixel transistor PT of the pixel circuit PXC and a light receiving element LRD connected to the sensor transistor ST of the sensor circuit SSC.

According to some embodiments, the light emitting element LED may include a first pixel electrode PEL1, a first hole transport layer HTL1, a light emitting layer EML, an electron transport layer ETL, and a second pixel electrode PEL2. According to some embodiments, the light receiving element LRD may include a first sensor electrode SEL1, a second hole transport layer HTL2, an electron blocking layer EBL, a light receiving layer LRL, an electron transport layer ETL, and a second sensor electrode SEL2.

According to some embodiments, the first pixel electrode PEL1 and the first sensor electrode SEL1 may be made of a metal such as Ag, Mg, Al, Pt, Pd, Au, Ni, Nd, Ir, Cr, or any alloy thereof, and/or indium tin oxide (ITO), indium zinc oxide (IZO), zinc oxide (ZnO), indium tin zinc oxide (ITZO), etc. The first pixel electrode PEL1 may be connected to the first drain electrode 12 through a contact hole. The first sensor electrode SEL1 may be connected to the second drain electrode 14 through a contact hole.

The first pixel electrode PEL1 and the first sensor electrode SEL1 may be simultaneously formed through patterning using a mask.

A bank layer BK (or pixel defining layer) defining a light emitting area EA and a light receiving area RA may be provided on the second insulating layer INS2 on which the first pixel electrode PEL1 and the first sensor electrode SEL1 are formed. The bank layer BK may be an organic insulating layer made of an organic material. The organic material may include acrylic resin, epoxy resin, phenolic resin, polyamide resin, polyimide resin, and the like.

Also, the bank layer BK may include light absorption material or have a light absorber coated thereon, to absorb light introduced from the outside. For example, the bank layer BK may include a carbon-based black pigment. However, embodiments according to the present disclosure are not limited thereto. The bank layer BK may include an opaque metal material such as chromium (Cr), molybdenum (Mo), an alloy (MoTi) of molybdenum and titanium, tungsten (W), vanadium (V), niobium (Nb), tantalum (Ta), manganese (Mn), cobalt (Co) or nickel (Ni), which has a high light absorption rate.

The bank layer BK may expose a top surface of the first pixel electrode PEL1 and a top surface of the first sensor electrode SEL1, and protrude from the second insulating layer INS2 along the circumference of the light emitting area EA and the circumference of the light receiving area RA. That is, the bank layer BK may include openings corresponding to the light emitting area EA and the light receiving area RA.

The first hole transport layer HTL1 may be provided on the top surface of the first pixel electrode PEL1, which is exposed by the bank layer BK, and the second hole transport layer HTL2 may be provided on the top surface of the first sensor electrode SEL1. Holes may be moved to the light emitting layer EML through the first hole transport layer HTL1, and holes may be moved to the light receiving layer LRL through the second hole transport layer HTL2.

According to some embodiments, the first hole transport layer HTL1 and the second hole transport layer HTL2 may be the same or be different from each other according to materials of the light emitting layer EML and the light receiving layer LRL.

The light emitting layer EML may be provided on the first hole transport layer HTL1 in the light emitting area EA surrounded by the bank layer BK. According to some embodiments, the light emitting layer EML may be configured as an organic light emitting layer. The light emitting layer EML may emit light such as red light, green light, or blue light according to an organic material included in the light emitting layer EML.

According to some embodiments, the electron blocking layer EBL may be provided on the second hole transport layer HTL2 in the light receiving area RA surrounded by the bank layer BK. The electron blocking layer EBL may block charges of the light receiving layer LRL from being moved to the second hole transport layer HTL2. According to some embodiments, the electron blocking layer EBL may include the same material as the first hole transport layer HTL1 of the light emitting area EA. According to some embodiments, the electron blocking layer EBL may be omitted.

The light receiving layer LRL may be located on the electron blocking layer EBL or the second hole transport layer HTL2. The light receiving layer LRL emits electrons, corresponding to light of a specific wavelength band, to sense an intensity of the light.

According to some embodiments, the light receiving layer LRL may include a low molecular organic material. For example, the light receiving layer LRL may be made of a phthalocyanine compound including at least one metal selected from the group consisting of copper (Cu), iron (Fe), nickel (Ni), cobalt (Co), manganese (Mn), aluminum (Al), palladium (Pd), tin (Sn), indium (In), lead (Pb), titanium (Ti), rubidium (Rb), vanadium (V), gallium (Ga), terbium (Tb), cerium (Ce), lanthanum (La), and zinc (Zn).

Alternatively, the low molecular organic material included in the light receiving layer LRL may have a bi-layered structure including a layer comprising a layer including a phthalocyanine compound including at least one metal selected from the group consisting of copper (Cu), iron (Fe), nickel (Ni), cobalt (Co), manganese (Mn), aluminum (Al), palladium (Pd), tin (Sn), indium (In), lead (Pb), titanium (Ti), rubidium (Rb), vanadium (V), gallium (Ga), terbium (Tb), cerium (Ce), lanthanum (La), and zinc (Zn), and a layer including C60. Alternatively, the low molecular organic material included in the light receiving layer LRL may have a single-layered structure in which a phthalocyanine compound and C60 are mixed.

However, this is merely illustrative, and the light receiving layer LRL may include a high molecular organic layer.

According to some embodiments, the light receiving layer LRL may determine a light detection band by controlling selection of a metal component included in the phthalocyanine compound. For example, the phthalocyanine compound including copper absorbs a visible light wavelength of a band of 600 nm to 800 nm (or about 600 nm to about 800 nm). The phthalocyanine compound including tin (Sn) absorbs a near-infrared light wavelength of a band of 800 nm to 1000 nm (or about 800 nm to 1000 nm). Therefore, the selection of a metal included in the phthalocyanine compound is controlled, so that a photo sensor capable of detecting a wavelength of a band required by a user can be implemented. For example, the light receiving layer LRL may be formed to selectively absorb a wavelength of a red light band, a wavelength of a green light band, or a wavelength of a blue light band.

According to some embodiments, an area of the light receiving area RA may be smaller than an area of the light emitting area EA. Thus, the existence of the light receiving area RA hardly has influence on light emission of the pixels PX1 to PX4 for image display, and an image quality to a certain level or more can be ensured.

According to some embodiments, the electron transport layer ETL may be provided on the light emitting layer EML and the light receiving layer LRL. The electron transport layer ETL may be integrally formed on the display area AA. Therefore, the electron transport layer ETL may be in contact with a top surface of the bank layer BK.

However, this is merely illustrative, and at least one of the first hole transport layer HTL1, the second hole transport layer HTL2, the electron blocking layer EBL, or the electron transport layer ETL may be omitted. In addition, a functional layer such as a hole injection layer or an electron injection layer may be added.

The second pixel electrode PEL2 may be provided on the electron transport layer ETL of the light emitting area EA, and the second sensor electrode SEL2 may be provided on the electron transport layer ETL of the light emitting area EA. According to some embodiments, the second pixel electrode PEL2 and the second sensor electrode SEL2 may be a common electrode CD in which the second pixel electrode PEL2 and the second sensor electrode SEL2 are integrally formed on the display area AA. A voltage of the same power source may be supplied to the second pixel electrode PEL2 and the second sensor electrode SEL2.

The second pixel electrode PEL2 and the second sensor electrode SEL2 may be configured as a metal layer such as Ag, Mg, Al, Pt, Pd, Au, Ni, Nd, Ir or Cr, and/or a transparent conductive layer such as ITO, IZO, ZnO or ITZO. According to some embodiments, the common electrode CD may be configured as a double-layer or multi-layer including a metal thin film. For example, the common electrode CD may be configured as a triple-layer of ITO/Ag/ITO.

The encapsulation layer TFE may be provided on the common electrode CD including the second pixel electrode PEL2 and the second sensor electrode SEL2. The encapsulation layer TFE may be configured as a single layer or be configured as a multi-layer. According to some embodiments, the encapsulation layer TFE may have a stack structure in which an inorganic material, an organic material, and an inorganic material are sequentially stacked. An uppermost layer of the encapsulation layer may be formed of an inorganic material.

According to some embodiments, the touch sensing layer TS_L may be located on the encapsulation layer TFE. The touch sensing layer TS_L may include a conductive pattern CP for touch sensing and an insulating layer TS_IL1 and TS_IL2. The conductive pattern CP of the touch sensing layer TS_L may be configured as a double-layer formed with a first touch insulating layer TS_IL1 interposed therebetween.

The first touch insulating layer TS_IL1 may be located on the encapsulation layer TFE. The main patterns PAT1 forming the first sensing cell SC1, the second sensing cell SC2, and the dummy electrode DM and the first connection patterns CNP1 may be located on the first touch insulating layer TS_IL1. According to some embodiments, the main patterns PAT1 and the first connection patterns CNP1 may include an opaque metal. For example, the opaque metal may include molybdenum, silver, titanium, copper, aluminum, and alloys thereof. The main patterns PAT1 and the first connection patterns CNP1 may have a multi-metal layer structure. For example, the main patterns PAT1 and the first connection patterns CNP1 may have a triple structure of molybdenum (Mo)/aluminum (Al)/molybdenum (Mo). However, this is merely illustrative, and the main patterns PAT1 and the first connection patterns CNP1 may have a triple structure of titanium (Ti)/aluminum (Al)/titanium (Ti).

According to some embodiments, the main patterns PAT1 and the first connection patterns CNP1 may include a transparent conductive material. For example, the transparent conductive material may include a transparent conductive oxide such as indium tin oxide (ITO), indium zinc oxide (IZO), zinc oxide (ZnO), or indium tin zinc oxide (ITZO). In addition, the transparent conductive material may include a conductive polymer such as PEDOT, a metal nano wire, graphene, and the like.

The main patterns PAT1 and the first connection patterns CNP1 may overlap the bank layer BK. According to some embodiments, the main patterns PAT1 and the first connection patterns CNP1 may be arranged to avoid the light emitting area EA and the light receiving area RA so as to ensure image quality and light receiving amount.

Light reflected by a main pattern PAT1 adjacent to the light receiving area RA may be incident onto the light receiving light LRL. The reliability of the photo sensor PHS can be ensured only when light receiving amounts of light receiving elements LRD are substantially uniform in an incident condition of the same light amount. Thus, all main patterns PAT1 adjacent to the light receiving area RA have a uniform shape, so that amounts of lights incident onto light receiving layers LRL of the light receiving elements LRD can become uniform.

A second touch insulating layer TS_IL2 may cover the main patterns PAT1 and the first connection patterns CNP1, and may be located on the first touch insulating layer TS_IL1. The first and second touch insulating layers TS_IL1 and TS_IL2 may include an organic insulating material and/or an inorganic insulating material.

The color filter layer CF_L may be located on the touch sensing layer TS_L. According to some embodiments, the color filter layer CF_L may include a black matrix BM and a color filter CF. The color filter layer CF_L may further include a transparent layer TPL.

The black matrix BM may be located on the second touch insulating layer TS_IL2. The black matrix BM may overlap the conductive pattern CP of the touch sensing layer TS_L and the bank layer BK.

According to some embodiments, the black matrix BM may form an optical system for transferring external light to the light receiving element LRD. The black matrix BM may absorb or block light introduced from the outside. The black matrix BM may include an organic light blocking material. For example, the organic light blocking material may include at least one of carbon black (CB) or titan black (TiBK), but embodiments according to the present disclosure are not necessarily limited thereto.

The black matrix BM may include a plurality of openings OP1 and OP2. According to some embodiments, the black matrix BM may be formed through a patterning process using a mask, a printing process, or the like. A first opening OP1 may overlap the light emitting area EA, and a second opening OP2 may overlap the light receiving area RA.

The color filter CF may be arranged to fill the first opening OP1. According to some embodiments, the color filter CF may cover at least a portion of the black matrix BM. The color filter CF may be one of a red color filter, a green color filter, and a blue color filter according to a color of light emitted in the light emitting area EA. For example, when green light is output in the light emitting area EA, the color filter CF may be the green color filter.

According to some embodiments, the color filter CF may be in direct contact with at least a portion of top and side surfaces of the black matrix BM. For example, the color filter CF may be located directly on the black matrix BM. Alternatively, any other material except an adhesive member for allowing the color filter CF and the black matrix BM to be adhered to each other is not interposed between the color filter CF and the black matrix BM.

According to some embodiments, the second opening OP2 may be filled with the transparent layer TPL while overlapping the light receiving area RA. For example, the transparent layer TPL may include a transparent organic material or a transparent inorganic material. However, this is merely illustrative, and the color filter CF may be filled in the second opening OP2. The color filter CF may be one of red color filter, green color filter, and a blue color filter according to a color of light sensed in the light receiving layer LRL. For example, when the light receiving layer LRL absorbs light in a green wavelength band, the color filter CF filled in the second opening OP2 may be the green color filter. Therefore, the color filter CF may be set regardless of colors of lights emitted from adjacent pixels PX1, PX2, PX3, and PX4.

Figure 8:
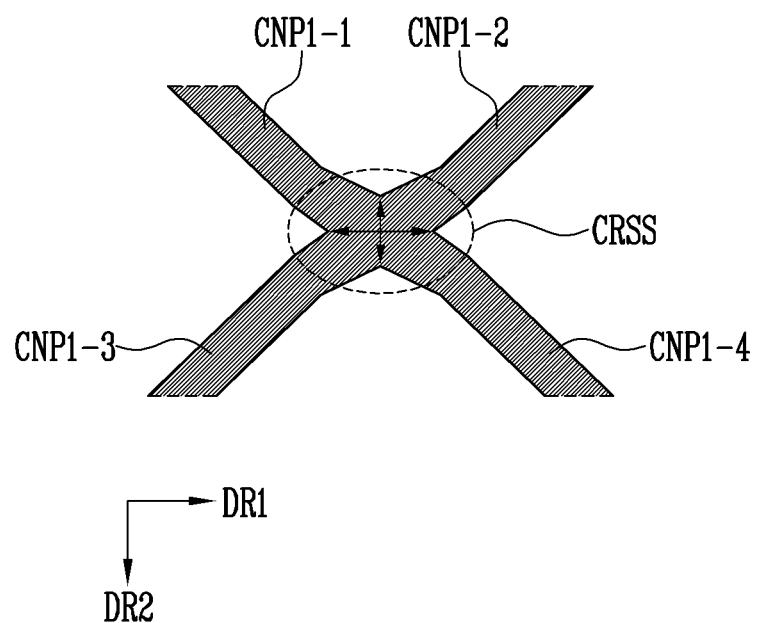
FIG. 8 is a view illustrating an example of a conductive pattern of the touch sensing layer shown in FIG. 6.

FIG. 8 is a view illustrating an example of the conductive pattern of the touch sensing layer shown in FIG. 6.

Referring to FIGS. 6 and 8, first connection patterns CNP1-1, CNP1-2, CNP1-3, and CNP1-4 may respectively extend in diagonal directions with respect to the first direction DR1 and the second direction DR2 from four different main patterns PAT1.

According to some embodiments, the first connection patterns CNP1-1, CNP1-2, CNP1-3, and CNP1-4 may be coupled to each other at a cross portion CRSS as a middle point. Accordingly, the four main patterns PAT1 connected to the respective first connection patterns CNP1-1, CNP1-2, CNP1-3, and CNP1-4 can be electrically connected to each other.

According to some embodiments, a width of the cross portion CRSS in the first direction DR1 and a width of the cross portion CRSS in the second direction DR2 may be greater than a width in a vertical direction with respect to an extending direction of each of the first connection patterns CNP1-1, CNP1-2, CNP1-3, and CNP1-4. In other words, the cross portion CRSS of the conductive pattern is formed relatively wider than another portion, so that a risk that the conductive pattern will be disconnected at the cross portion CRSS can be reduced.

Figure 9:
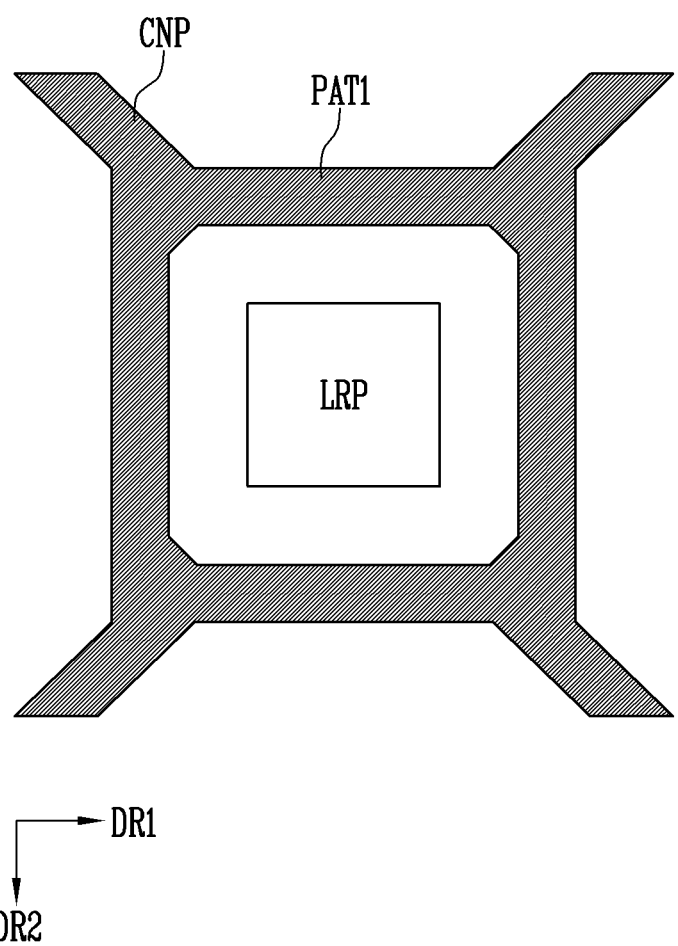
FIG. 9 is a view illustrating an example of the conductive pattern of the touch sensing layer shown in FIG. 6.

FIG. 9 is a view illustrating an example of the conductive pattern of the touch sensing layer shown in FIG. 6.

Referring to FIGS. 6 and 9, a main pattern PAT1 may be connected to four connection patterns CNP (or first connection patterns CNP1).

The connection patterns CNP may extend in four different directions from the main pattern PAT1.

According to some embodiments, portions at which the main pattern PAT1 and the connection patterns CNP are coupled to each other may be formed relatively wider than another portion. Thus, a risk that the conductive pattern will be disconnected at the portions at which the main pattern PAT1 and the connection patterns CNP are coupled to each other can be reduced.

Figure 10:
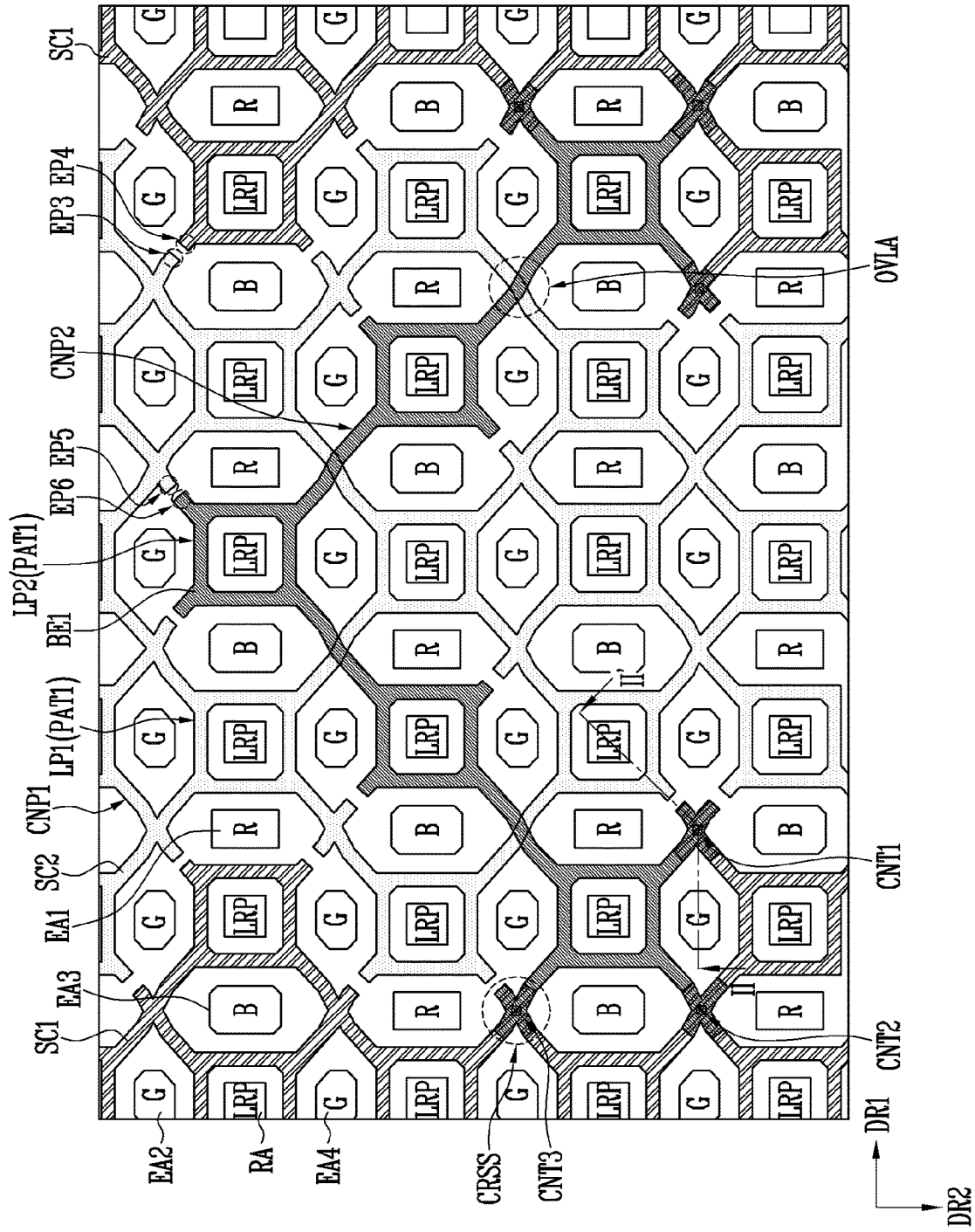
FIG. 10 is a plan view illustrating an example of a portion of the touch sensing layer shown in FIG. 5, which is on the pixel element layer shown in FIG. 2.

FIG. 10 is a plan view illustrating an example of a portion of the touch sensing layer shown in FIG. 5, which is located on the pixel element layer shown in FIG. 2.

In FIG. 10, components identical to those described with reference to FIG. 6 are designated by like reference numerals, and their duplicated descriptions will be omitted.

Referring to FIGS. 2, 3, 5, and 10, the touch sensing layer TS_L may include a first sensing cell SC1, a second sensing cell SC2, and a bridge electrode BE.

On the plan view shown in FIG. 10, it may be understood that the other portion except the first to fourth light emitting areas EA1 to EA4 and the light receiving area RA is a bank area BA. In addition, FIG. 10 shows an enlarged example of an area including boundaries of the first sensing cell SC1, the second sensing cell SC2, and a first bridge electrode BE1 of the dummy electrode DM.

The first sensing cell SC1 and the second sensing cell SC2 may be located in the same layer, and the bridge electrode BE including the first bridge electrode BE1 may be located in a layer different from the layer in which the first sensing cell SC1 and the second sensing cell SC2 are located.

According to some embodiments, a main pattern PAT1 may include a first layer pattern LP1 and a second layer pattern LP2, which are located in different layers with an insulating layer interposed therebetween. The first layer pattern LP1 and the second layer pattern LP2 may surround different light receiving parts LRP (e.g., different light receiving layers). For example, the first layer pattern LP1 may be arranged upwardly from the second layer pattern LP2. However, this is merely illustrative, and the first layer pattern LP1 may be arranged downwardly from the second layer pattern LP2.

According to some embodiments, the first layer pattern LP1 and the second layer pattern LP2 may have the same shape.

According to some embodiments, the first layer pattern LP1 and a first connection pattern CNP1 formed in the same layer as the first layer pattern LP1 may form the first sensing cell SC1 and the second sensing cell SC2. For example, a third end portion EP3 and a fifth end portion EP5 of the first connection pattern CP1 may form a boundary of the second sensing cell SC2. In addition, a fourth end portion EP4 of the first connection pattern CPN1 may form a boundary of the first sensing cell SC1. The first connection pattern CNP1 may extend in a diagonal direction with respect to the first and second directions DR1 and DR2.

According to some embodiments, the second layer pattern LP2 and a second connection pattern CNP2 formed in the same layer as the second layer pattern LP2 may form the first bridge electrode BE1. A sixth end portion EP6 of the second connection pattern CNP may form a boundary of the first bridge electrode BE1.

A portion of the first bridge electrode BE1 may overlap a portion of the second sensing cell SC2 or a portion of a connection electrode CNE in a plan view.

According to some embodiments, a portion of the second connection pattern CNP2 may overlap a portion of the first connection pattern CNP1 forming the second sensing cell SC2 and/or the connection electrode CNE (e.g., 'OVLA' shown in FIG. 10). As described above, because the first layer pattern LP1 and the second layer pattern LP2 are designed to surround different light receiving parts LRP (e.g., different light receiving layers), the first layer pattern LP1 and the second layer pattern LP2 do not overlap each other. Thus, the area of a portion at which a first sensing electrode including the first bridge electrode BE1 and the first sensing cell SC1 and a second sensing electrode including the second sensing cell SC2 overlap each other can be minimized. Accordingly, a risk that a short circuit will occur between the first sensing electrode and the second sensing electrode and generation of an unnecessary capacitance (e.g., a parasitic capacitance) can be reduced.

The first bridge electrode BE1 may have a shape to which second layer patterns LP2 adjacent to each other in diagonal directions are connected. Also, the first bridge electrode BE1 does not surround the light emitting areas EA1, EA2, EA3, and EA4. When viewed on a plane, the first bridge electrode BE1 does not surround the light emitting layers.

The first bridge electrode BE1 and the first sensing cell SC1 may be connected to each other through a contact hole. According to some embodiments, in FIG. 10, the first bridge electrode BE1 may be connected to a first sensing cell located at a left side through first to third contact holes CNT1, CNT2, and CNT3. The first to third contact holes CNT1, CNT2, and CNT3 may be provided not to overlap the light emitting areas EA1, EA2, EA3, and EA4 (e.g., the light emitting layers) between adjacent light receiving parts. The first to third contact holes CNT1, CNT2, and CNT3 may overlap the bank area BA.

According to some embodiments, the first connection pattern CNP1 of the first sensing cell SC1 and the second connection pattern CNP2 of the first bridge electrode BE1 may overlap an area corresponding to each of the first to third contact holes CNT1, CNT2, and CNT3. For example, a cross portion CRSS of the first connection pattern CNP1 and a cross portion CRSS of the second connection pattern CNP2 may overlap or accord with each other. Each of the first to third contact holes CNT1, CNT2, and CNT3 may be formed to overlap a cross portion CRSS. Accordingly, the area of a cross portion CRSS corresponding to each of the first to third contact holes CNT1, CNT2, and CNT3 can be widely secured. Thus, a risk that a short circuit will occur in a contact area of the first bridge electrode bE1 and the first sensing cell SC1 can be reduced.

A second bridge electrode BE2 may be designed to have the substantially same configuration as the first bridge electrode BE1, only except that an arrangement form of the second bridge electrode BE2 is partially different from an arrangement form of the first bridge electrode BE1. For example, the second bridge electrode BE2 may have a shape symmetrical to the first bridge electrode BE1 with respect to an axis parallel to the first direction DR1.

Figure 11:
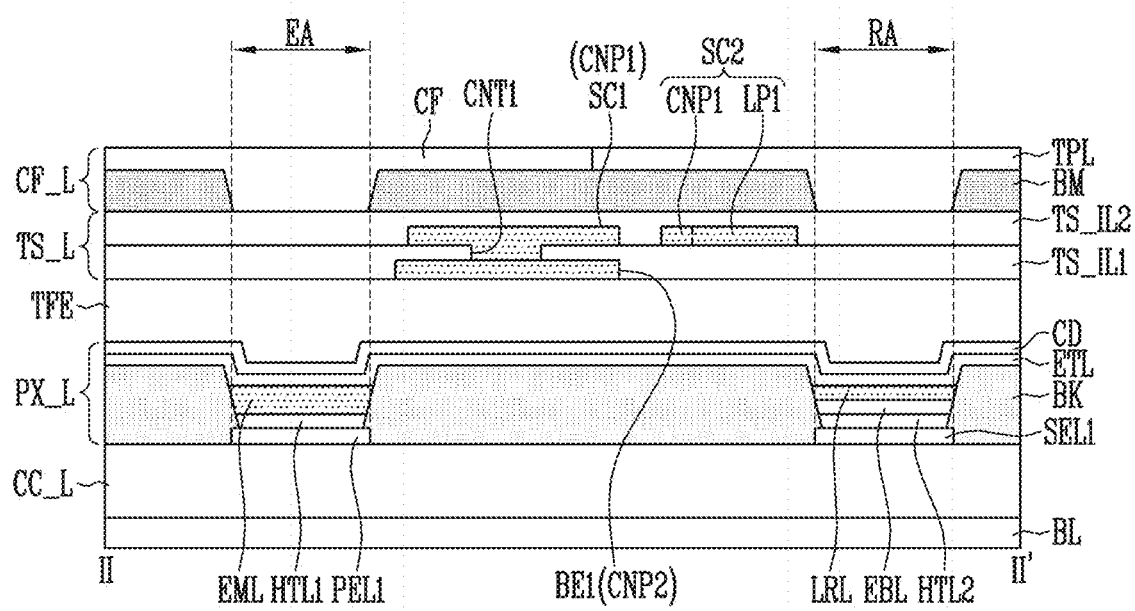
FIG. 11 is a sectional view illustrating an example taken along the line II-II' shown in FIG. 10.
Figure 11:
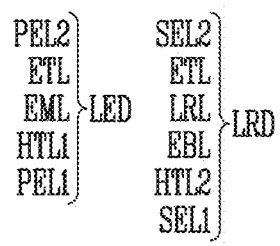

FIG. 11 is a sectional view illustrating an example taken along line II-II' shown in FIG. 10.

In FIG. 11, components identical to those described with reference to FIG. 7 are designated by like reference numerals, and their duplicated descriptions will be omitted. Also in FIG. 11, detailed illustration of the circuit layer CC_L is omitted.

Referring to FIGS. 2, 3, 10, and 11, the display area AA of the display device 1000 may include the base layer BL, the circuit layer CC_L, the pixel element layer PX_L, the encapsulation layer TFE, the touch sensing layer TS_L, and the color filter layer CF_L.

According to some embodiments, a conductive layer including a first bridge electrode BE1 may be located on the encapsulation layer TFE. A second connection pattern CNP2 of the first bridge electrode BE1 may overlap the bank layer BK and the black matrix BM.

The first touch insulating layer TS_IL1 may cover the first bridge electrode BE1.

A first layer pattern LP1 and a first connection pattern CNP1 may be located on the first touch insulating layer TS_IL1. The first layer pattern LP1 and the first connection pattern CNP1 may form a first sensing cell SC1 and/or a second sensing cell SC2. The first and second sensing cells SC1 and SC2 may overlap the bank layer BK and the black matrix BM.

The first connection pattern CNP1 of the first sensing cell SC1 and the second connection pattern CNP2 of the first bridge electrode BE1 may be connected to each other through a first contact hole CNT1.

The second touch insulating layer TS_IL2 covering the first and second sensing cells SC1 and SC2 may be located on the first touch insulating layer TS_IL1.

Figure 12:
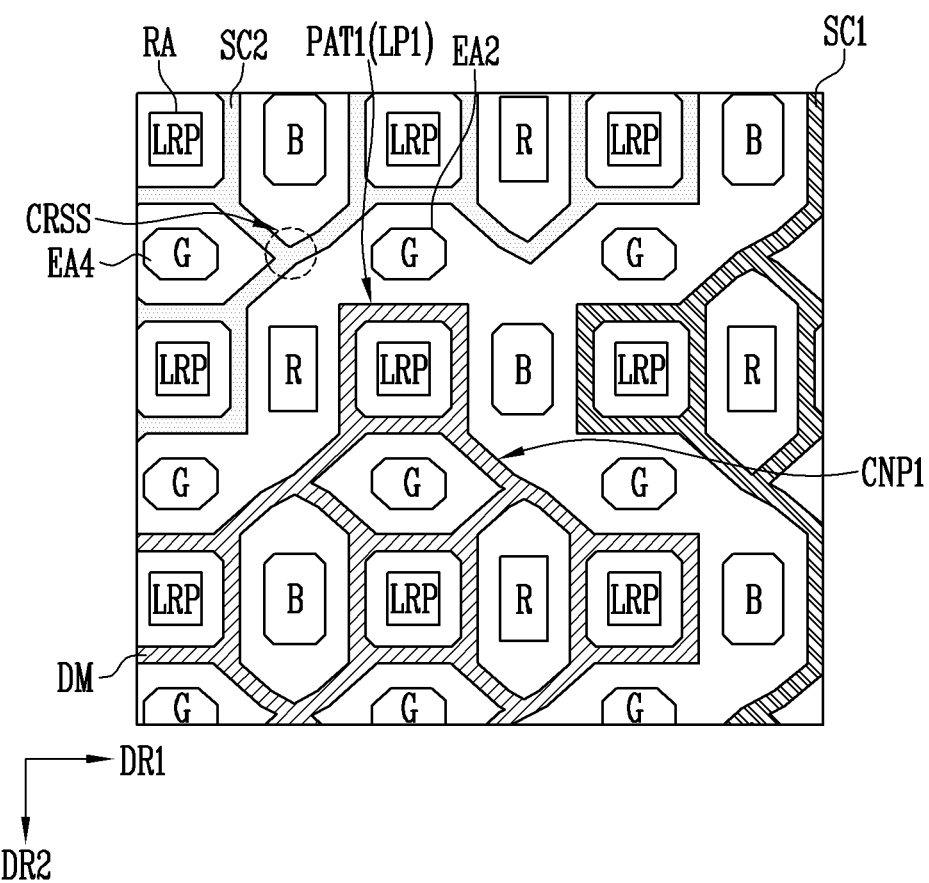
FIG. 12 is a plan view illustrating an example of a portion of the touch sensing layer shown in FIG. 5, which is on the pixel element layer shown in FIG. 2.
Figure 13:
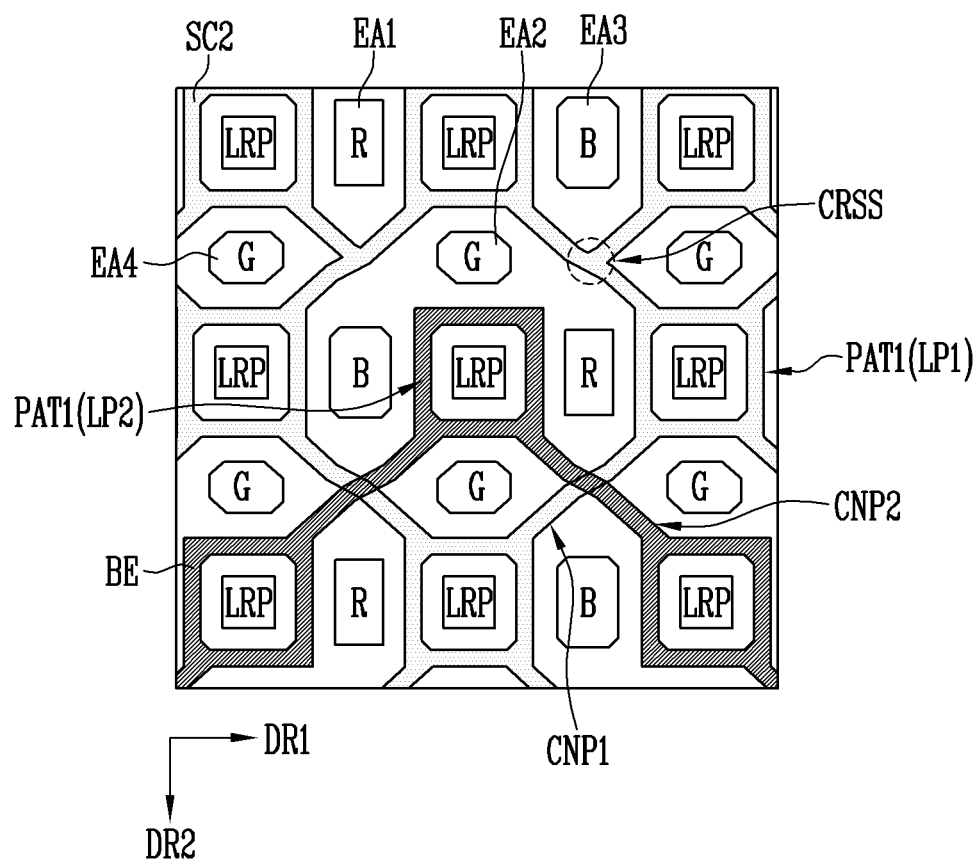
FIG. 13 is a plan view illustrating an example of another portion of the touch sensing layer shown in FIG. 5, which is on the pixel element layer shown in FIG. 2.

FIG. 12 is a plan view illustrating an example of a portion of the touch sensing layer shown in FIG. 5, which is located on the pixel element layer shown in FIG. 2. FIG. 13 is a plan view illustrating an example of another portion of the touch sensing layer shown in FIG. 5, which is located on the pixel element layer shown in FIG. 2.

In FIGS. 12 and 13, components identical to those described with reference to FIGS. 6 and 10 are designated by like reference numerals, and their duplicated descriptions will be omitted.

Referring to FIGS. 2, 3, 5, 12, and 13, the touch sensing layer TSL may include a first sensing cell SC1, a second sensing cell SC2, a dummy electrode DM, and a bridge electrode BE.

The first sensing cell SC1, the second sensing cell SC2, the dummy electrode DM, and the bridge electrode BE may be formed in a conductive pattern CP having a mesh form.

As shown in FIG. 12, the first sensing cell SC1, the second sensing cell SC2, and the dummy electrode DM may be provided in the same layer. For example, a first layer pattern LP1 of a main pattern PAT1 may surround each of light receiving parts LRP (and light receiving areas RA) corresponding to the first sensing cell SC1, the second sensing cell SC2, and the dummy electrode DM. Adjacent first layer patterns LP1 may be connected to each other by a first connection pattern CNP1 located in the same layer as the first layer pattern LP1.

As shown in FIG. 13, the bridge electrode BE may be located in a layer different from the layer in which the first sensing cell SC1, the second sensing cell SC2, and the dummy electrode DM are located. The first layer pattern LP1 of the main pattern PAT1 may surround each of light receiving parts LRP (and light receiving areas RA) corresponding to the bridge electrode BE. Adjacent second layer patterns LP2 may be connected to each other by a second connection pattern CNP2 located in the same layer as the second layer pattern LP2. In addition, a portion of the second connection pattern CNP2 forming the bridge electrode BE and a portion of the first connection pattern CNP1 forming the second sensing cell SC2 may overlap each other.

According to some embodiments, end portions defining a boundary of each of the first sensing cell SC1, the second sensing cell SC2, the dummy electrode DM, and the bridge electrode BE may be respectively formed not to protrude from the main pattern PAT1 and a cross portion CRSS. Accordingly, the conductive pattern CP surrounding light emitting areas EA1, EA2, EA3, and EA4 corresponding to each of the first sensing cell SC1, the second sensing cell SC2, and the dummy electrode DM may have a closed loop shape. For example, each of the light emitting areas EA1, EA2, EA3, and EA4 may have a hexagonal ring shape due to a portion of the first layer pattern LP1 and a portion of the first connection pattern CNP1.

As described above, a protrusion portion of the conductive pattern CP from the main pattern PAT1 and the cross portion CRSS is removed, so that an unintended capacitance (e.g., a parasitic capacitance or the like) between conductive patterns CP spaced apart from each other can be further reduced.

Figure 14:
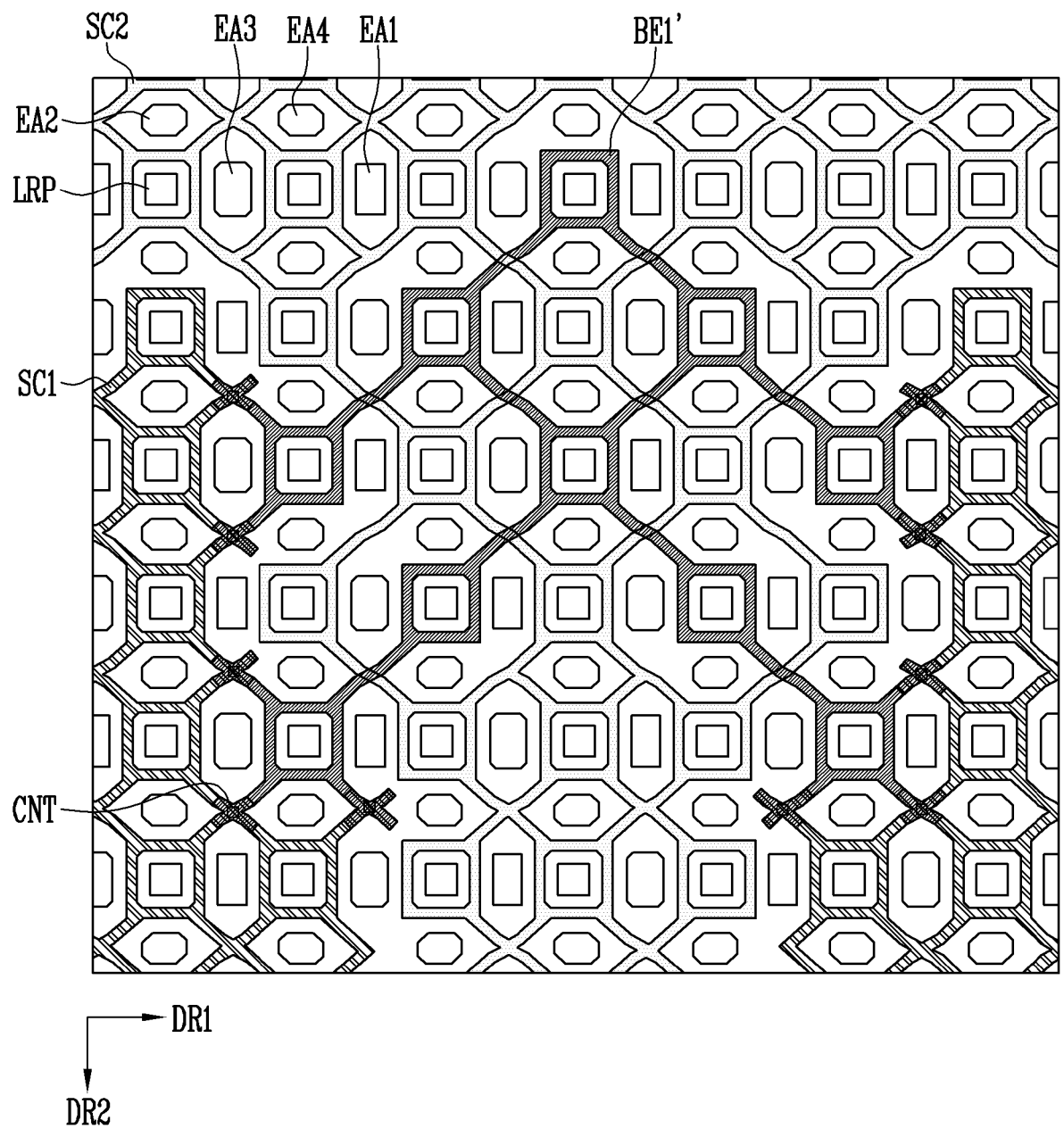
FIG. 14 is a plan view illustrating an example of a portion of the touch sensing layer shown in FIG. 5, which is on the pixel element layer shown in FIG. 2.

FIG. 14 is a plan view illustrating an example of a portion of the touch sensing layer shown in FIG. 5, which is located on the pixel element layer shown in FIG. 2.

In FIG. 14, components identical to those described with reference to FIG. 10 are designated by like reference numerals, and their duplicated descriptions will be omitted. FIG. 14 shows an example of an area including boundaries of a first sensing cell SC1, a second sensing cell SC2, and a first bridge electrode BE1'.

Referring to FIGS. 2, 5, 10, and 14, the touch sensing layer TS_L may include a first sensing cell SC1, a second sensing cell SC2, and a first bridge electrode BE1'.

According to some embodiments, the first bridge electrode BE1' may have a double bridge structure. For example, the first bridge electrode BE1' may have a structure in which the first bridge electrode BE1 shown in FIG. 10 is connected thereto. The first bridge electrode BE1' may be connected to the first sensing cell SC1 through a contact hole.

A second bridge electrode may have a shape symmetrical to the first bridge electrode BE1' with respect to an axis parallel to the first direction DR1.

As described above, a current path of a bridge electrode BE including the first bridge electrode BE1' is increased, so that the resistance (and RC delay) of a first sensing electrode configured with the first sensing cell SC1 and the bridge electrode BE can be decreased. A resistance ratio between the first sensing electrode and a second sensing electrode can be adjusted so as to improve the reliability of touch sensing.

In the display device including the light receiving element between the light emitting elements according to some embodiments of the present disclosure, the conductive pattern of the touch sensing layer overlapping the bank area may include main patterns respectively surrounding light receiving parts (e.g., light receiving layers of light receiving elements) in a closed form having substantially the same shape. In addition, the first sensing cell, the second sensing cell, and the dummy electrode may be separated from each other by removing portions of the first connection patterns connected between the main patterns. Thus, amounts of light reflected from the main patterns having a relatively uniform shape and then incident onto the light receiving parts may be substantially uniform for every light receiving element, and the reliability of the photo sensor may be relatively improved.

Further, because the first layer pattern forming the first and second sensing cells (and the connection electrode) and the second layer pattern forming the bridge electrode do not overlap each other, the area of a portion at which the bridge electrode and the first and second sensing cells overlap each other may be minimized. Thus, a risk that a short circuit will occur between the first sensing electrode and the second sensing electrode and generation of an unnecessary capacitance (e.g., a parasitic capacitance, or the like) may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims, and their equivalents.

What is claimed is:

1. A display device comprising:
a base layer;
a circuit layer on the base layer, the circuit layer including pixel circuits and sensor circuits;
a pixel element layer on the circuit layer, the pixel element layer including light emitting elements respectively connected to the pixel circuits and light receiving elements respectively connected to the sensor circuits;
an encapsulation layer covering the pixel element layer; and
a touch sensing layer on the encapsulation layer, the touch sensing layer including a conductive pattern forming touch electrodes for sensing a touch,
wherein the light emitting elements include light emitting layers, and the light receiving elements include light receiving layers, respectively,
wherein the conductive pattern includes main patterns respectively surrounding the light receiving layers in a closed form in a plan view, and
wherein the main patterns include first layer patterns and second layer patterns, which are in different layers with an insulating layer interposed therebetween.

2. The display device of claim 1, wherein each of the main patterns does not overlap the light receiving layers in the plan view.

3. The display device of claim 1, wherein the main patterns have a uniform planar shape.

4. The display device of claim 2, wherein the conductive pattern further includes connection patterns connecting adjacent main patterns to each other, and
wherein the connection patterns do not overlap the light emitting layers in the plan view.

5. The display device of claim 4, wherein a portion of the connection patterns includes an end portion which is cut off corresponding to a boundary of the touch electrodes.

6. The display device of claim 2, wherein a portion of the conductive pattern surrounds a corresponding light emitting layer among the light emitting layers in a closed form, and
wherein another portion of the conductive pattern includes an open end portion with respect to light emitting layers overlapping a boundary of the touch electrodes among the light emitting layers.

7. The display device of claim 2,
wherein the first layer patterns and the second layer patterns respectively surround different light receiving layers.

8. The display device of claim 7, wherein the touch electrodes include:
a first sensing electrode including first sensing cells spaced apart from each other and arranged along a first direction;
a second sensing electrode on a same layer as the first sensing electrode, the second sensing electrode including second sensing cells arranged along a second direction intersecting the first direction; and
a bridge electrode on a layer different from the layer on which the first sensing electrode and the second sensing electrode are located, the bridge electrode being connected between the first sensing cells adjacent to each other through a contact hole.

9. The display device of claim 8, wherein each of the first sensing cells and the second sensing cells is formed by connecting the first layer patterns to each other through first connection patterns formed in a same layer as the first layer patterns.

10. The display device of claim 9, wherein a boundary of each of the first sensing cells and the second sensing cells is formed by a cut-off end portion of each of the first connection patterns.

11. The display device of claim 9, wherein each of the first sensing cells and the second sensing cells includes a cross portion at which the first connection patterns are coupled to each other, and
wherein end portions of the first connection patterns, which define a boundary of each of the first sensing cells and the second sensing cells, are formed not to protrude from the cross portion in the plan view.

12. The display device of claim 9, wherein the bridge electrode is formed by connecting the second layer patterns to each other through a second connection pattern formed in a same layer as the second layer patterns,
wherein the contact hole is provided not to overlap the light emitting layers between adjacent light receiving layers,
wherein a first connection pattern and a second connection pattern, which overlap with each other through the contact hole, are electrically connected to each other,
wherein the first connection pattern extends in a diagonal direction with respect to the first and second directions from a corresponding first layer pattern, and
wherein the second connection pattern extends in the diagonal direction from a corresponding second layer pattern.

13. The display device of claim 12, wherein the bridge electrode has a shape in which the second layer patterns adjacent to each other in the diagonal direction are connected to each other, and
wherein the bridge electrode does not surround the light emitting layers in the plan view.

14. The display device of claim 8, wherein the touch electrodes further include a dummy electrode between the first sensing electrode and the second sensing electrode, the dummy electrode being electrically insulated from the first sensing electrode and the second sensing electrode, and
wherein each of the first sensing cells, the second sensing cells, and the dummy electrode is formed by connecting the first layer patterns to each other through a first connection pattern formed in a same layer as the first layer patterns.

15. The display device of claim 12, wherein each of the light emitting elements further includes:
- a first pixel electrode provided between the circuit layer and a corresponding light emitting layer among the light emitting layers; and
- a second pixel electrode on the corresponding light emitting layer, wherein each of the light receiving elements further includes:
- a first sensor electrode in a same layer as the first pixel electrode, and provided between the circuit layer and a corresponding light receiving layer among the light receiving layers; and
- a second sensor electrode on the corresponding light receiving layer, and wherein the second pixel electrode and the second sensor electrode are integrally formed.

16. The display device of claim 15, wherein the pixel element layer further includes a bank layer in contact with a side surface of each of the light emitting layers and the light receiving layers to define a light emitting area and a light receiving area and being, and
- wherein the first layer pattern, the second layer pattern, the first connection pattern, and the second connection pattern overlap the bank layer.

17. The display device of claim 16, further comprising:
- a black matrix on the touch sensing layer, the black matrix including first openings overlapping the light emitting layers and second openings overlapping the light receiving layers; and
- a color filter on the touch sensing layer while filling at least one of the first openings or the second openings of the black matrix, wherein the first layer pattern, the second layer pattern, the first connection pattern, and the second connection pattern overlap the black matrix.

18. A display device comprising:
- a base layer;
- a circuit layer on the base layer, the circuit layer including pixel circuits and sensor circuits;
- a pixel element layer on the circuit layer, the pixel element layer including light emitting elements respectively provided with light emitting layers and light receiving elements respectively provided with light receiving layers;
- an encapsulation layer covering the pixel element layer;
- a touch sensing layer on the encapsulation layer, the touch sensing layer including a conductive pattern forming sensing cells for sensing a touch and a bridge electrode;
- a black matrix on the touch sensing layer, the black matrix including first openings overlapping the light emitting layers and second openings overlapping the light receiving layers; and
- a color filter on the touch sensing layer while filling at least one of the first openings or the second openings, wherein the conductive pattern overlaps the black matrix while surrounding the second openings in a closed form in a plan view, wherein the conductive pattern includes:
- a first layer pattern forming the sensing cells, the first layer pattern surrounding each of portions of the second openings in the closed form; and
- a second layer pattern including the bridge electrode, the second layer pattern surrounding each of another portions of the second openings in the closed form, wherein the second layer pattern is on a layer different from the first layer pattern.

19. The display device of claim 18,
wherein a planar shape of the first layer pattern and a planar shape of the second layer pattern are the same.

20. A display device comprising:
- a base layer;
- a circuit layer on the base layer, the circuit layer including pixel circuits and sensor circuits;
- a pixel element layer on the circuit layer, the pixel element layer including light emitting elements respectively connected to the pixel circuits and light receiving elements respectively connected to the sensor circuits;
- an encapsulation layer covering the pixel element layer; and
- a touch sensing layer on the encapsulation layer, the touch sensing layer including a conductive pattern forming touch electrodes for sensing a touch, wherein the light receiving elements include light receiving layers, respectively, wherein the conductive pattern includes main patterns surrounding at least a portion of each of the light receiving layers, wherein the main patterns have a uniform shape in a plan view, and wherein the main patterns include first layer patterns and second layer patterns, which are in different layers with an insulating layer interposed therebetween.

* * * * *